(12) United States Patent
Sato et al.

(10) Patent No.: US 6,574,154 B2
(45) Date of Patent: *Jun. 3, 2003

(54) DATA TRANSMITTER

(75) Inventors: Takashi Sato, Koganei (JP); Yoji Nishio, Hitachi (JP); Yoshinobu Nakagome, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/988,152

(22) Filed: Nov. 19, 2001

(65) Prior Publication Data

US 2002/0031016 A1 Mar. 14, 2002

Related U.S. Application Data

(63) Continuation of application No. 09/646,010, filed on Sep. 12, 2000, now Pat. No. 6,359,815.

(51) Int. Cl.[7] .................................................. G11C 7/00
(52) U.S. Cl. ........................ 365/198; 365/194; 327/393; 326/86
(58) Field of Search .................................. 365/198, 194, 365/189.01; 326/86; 327/393, 403

(56) References Cited

U.S. PATENT DOCUMENTS

| 4,795,985 A | * | 1/1989 | Gailbreath, Jr. ............. 327/158 |
| 5,452,436 A | | 9/1995 | Arai et al. ................... 709/400 |
| 6,043,694 A | | 3/2000 | Dortu .......................... 327/156 |

FOREIGN PATENT DOCUMENTS

| JP | 3157030 | 7/1991 |
| JP | 575594 | 3/1993 |

* cited by examiner

*Primary Examiner*—Hoai Ho
(74) *Attorney, Agent, or Firm*—Antonelli, Terry, Stout & Kraus, LLP

(57) ABSTRACT

A large difference in the lengths of the passages or a large difference in the load capacitances inclusive of parasitic elements of parallel data wirings can cause differences in the propagation time of data on the parallel data wirings. The invention provides a simultaneous arrival judging circuit for comparing phases of part or whole bits of data received from the parallel data wirings, and a timing adjusting mechanism for adjusting phases among parallel bits of the received data based on the judged results of the simultaneous arrival judging circuit, so that the data bits arrive simultaneously at a receiver.

3 Claims, 23 Drawing Sheets

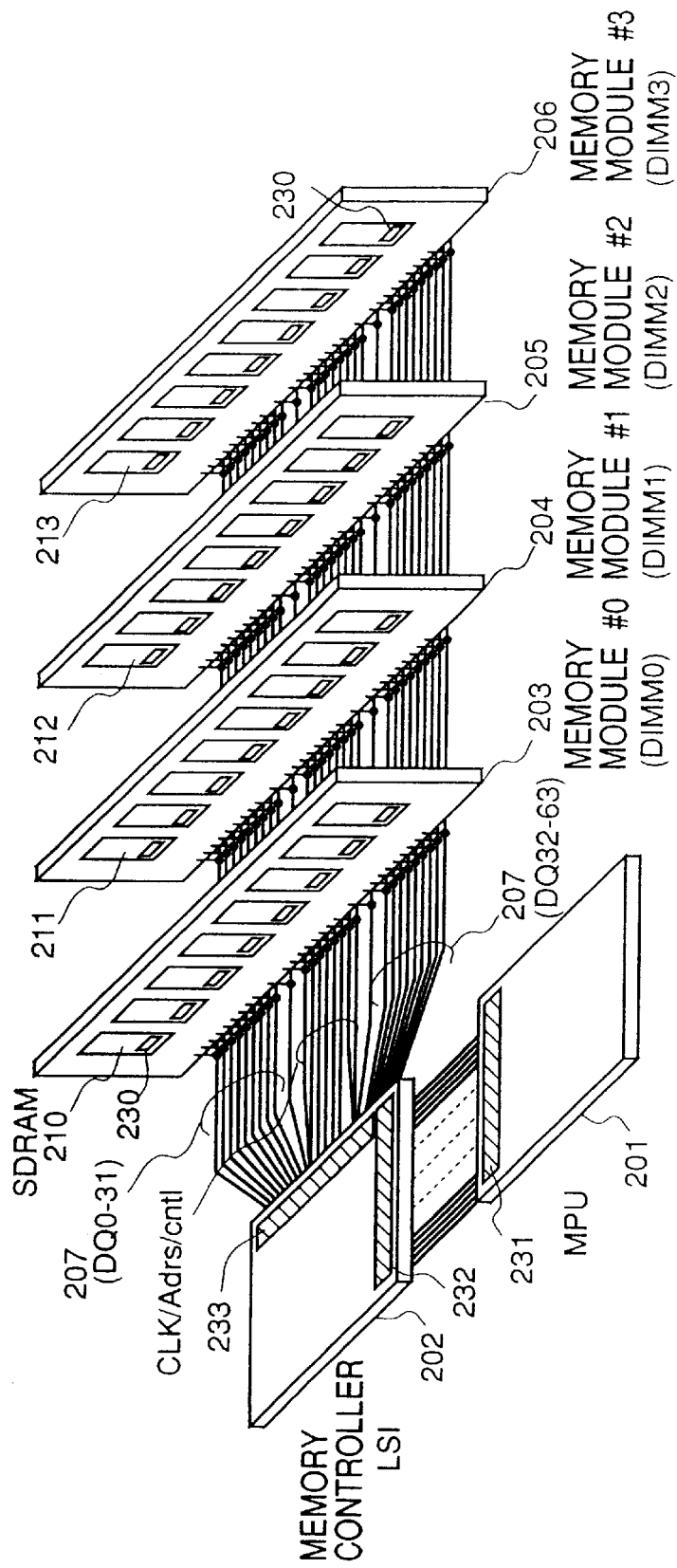

FIG. 7

| DBSi #5 | #4 | #3 | #2 | #1 | #0 | DQ# on DIMM | SDRAM# | DQ# on SDRAM | TB1 | TB0 |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 1 | 1 | 0 | 1 | 0 | 1 |
| 0 | 0 | 0 | 0 | 1 | 0 | 2 | 0 | 2 | 1 | 0 |
| 0 | 0 | 0 | 0 | 1 | 1 | 3 | 0 | 3 | 1 | 1 |
| 0 | 0 | 0 | 1 | 0 | 0 | 4 | 1 | 0 | 0 | 0 |
| 0 | 0 | 0 | 1 | 0 | 1 | 5 | 1 | 1 | 0 | 1 |
| 0 | 0 | 0 | 1 | 1 | 0 | 6 | 1 | 2 | 1 | 0 |
| 0 | 0 | 0 | 1 | 1 | 1 | 7 | 1 | 3 | 1 | 1 |
| 0 | 0 | 1 | 0 | 0 | 0 | 8 | 2 | 0 | 0 | 0 |
| 0 | 0 | 1 | 0 | 0 | 1 | 9 | 2 | 1 | 0 | 1 |
| 0 | 0 | 1 | 0 | 1 | 0 | 10 | 2 | 2 | 1 | 0 |
| 0 | 0 | 1 | 0 | 1 | 1 | 11 | 2 | 3 | 1 | 1 |
| 0 | 0 | 1 | 1 | 0 | 0 | 12 | 3 | 0 | 0 | 0 |
| 0 | 0 | 1 | 1 | 0 | 1 | 13 | 3 | 1 | 0 | 1 |
| 0 | 0 | 1 | 1 | 1 | 0 | 14 | 3 | 2 | 1 | 0 |
| 0 | 0 | 1 | 1 | 1 | 1 | 15 | 3 | 3 | 1 | 1 |
| 0 | 1 | 0 | 0 | 0 | 0 | 16 | 4 | 0 | 0 | 0 |
| 0 | 1 | 0 | 0 | 0 | 1 | 17 | 4 | 1 | 0 | 1 |
| 0 | 1 | 0 | 0 | 1 | 0 | 18 | 4 | 2 | 1 | 0 |
| 0 | 1 | 0 | 0 | 1 | 1 | 19 | 4 | 3 | 1 | 1 |
| 0 | 1 | 1 | 1 | 0 | 0 | 20 | 5 | 0 | 0 | 0 |
| ... | ... | ... | ... | ... | ... | ... | ... | ... | ... | ... |
| 1 | 1 | 1 | 1 | 1 | 0 | 62 | 15 | 2 | 1 | 0 |
| 1 | 1 | 1 | 1 | 1 | 1 | 63 | 15 | 3 | 1 | 1 |

FIG. 9

| CR | CW | MEANING |
|---|---|---|
| 0 | 0 | NORMAL DRAM OPERATION MODE |
| 0 | 1 | MODE FOR SO ADJUSTING THAT THE BITS OUTPUT FROM THE MEMORY CONTROLLER LSI SIMULTANEOUSLY ARRIVE AT SDRAM |
| 1 | 0 | MODE FOR SO ADJUSTING THAT THE BITS OUTPUT FROM THE SDRAM SIMULTANEOUSLY ARRIVE AT THE MEMORY CONTROLLER LSI |
| 1 | 1 | INHIBITED |

FIG. 12

| CUP | CDN | MEANING |
|---|---|---|
| 0 | 0 | REF SGL IS IN SYNCHRONISM WITH OBJECT DATA SGL, OR NORMALLY OPERATING |
| 0 | 1 | REF SGL IS ARRIVING EARLIER THAN DATA SGL |
| 1 | 0 | DATA SGL IS ARRIVING EARLIER THAN REF SGL |
| 1 | 1 | INHIBITED |

FIG. 19A

| CLK2-DQ SYNC | SYNC AT DIMM0 | CLK2-DQ0:63 SYNC |
|---|---|---|
| | SYNC AT DIMM1 | CLK2-DQ0:63 SYNC |
| | SYNC AT DIMM2 | CLK2-DQ0:63 SYNC |
| | SYNC AT DIMM3 | CLK2-DQ0:63 SYNC |

FIG. 19B

| CLK-DQSi SYNC | CLK-DQS0 SYNC | CLK-DQS0(FROM DIMM0) SYNC |
|---|---|---|
| | | CLK-DQS0(FROM DIMM1) SYNC |
| | | CLK-DQS0(FROM DIMM2) SYNC |
| | | CLK-DQS0(FROM DIMM3) SYNC |
| | CLK-DQS1 SYNC | CLK-DQS1(FROM DIMM0:3) SYNC |
| | CLK-DQS2 SYNC | CLK-DQS2(FROM DIMM0:3) SYNC |
| | CLK-DQS3 SYNC | CLK-DQS3(FROM DIMM0:3) SYNC |
| DQS-DQ SYNC | DQS-DQ FROM DIMM0 SYNC | DQS0-DQ0:15 SYNC |
| | | DQS1-DQ16:31 SYNC |
| | | DQS2-DQ32:47 SYNC |
| | | DQS3-DQ48:63 SYNC |
| | FROM DIMM1 SYNC | DQS0:3-DQ0:63 SYNC |
| | FROM DIMM2 SYNC | DQS0:3-DQ0:63 SYNC |
| | FROM DIMM3 SYNC | DQS0:3-DQ0:63 SYNC |

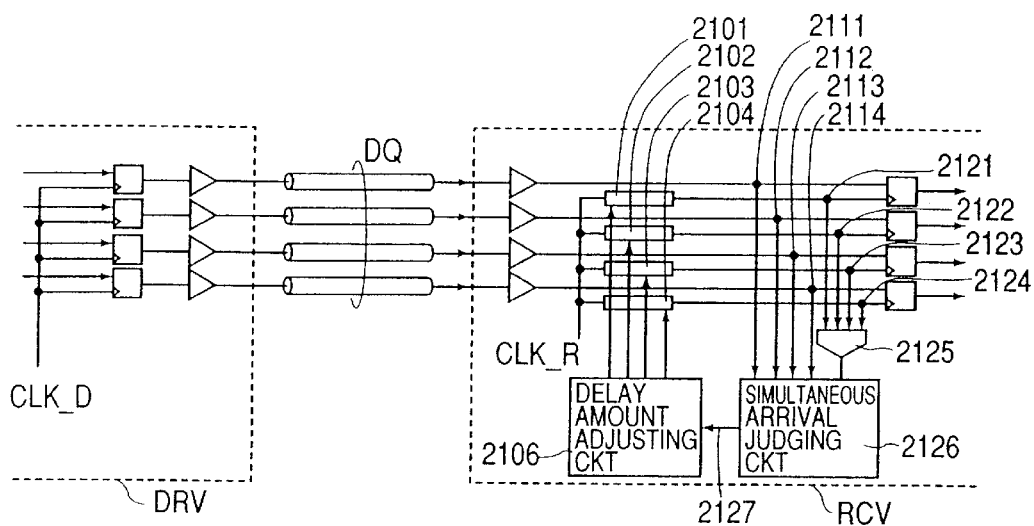
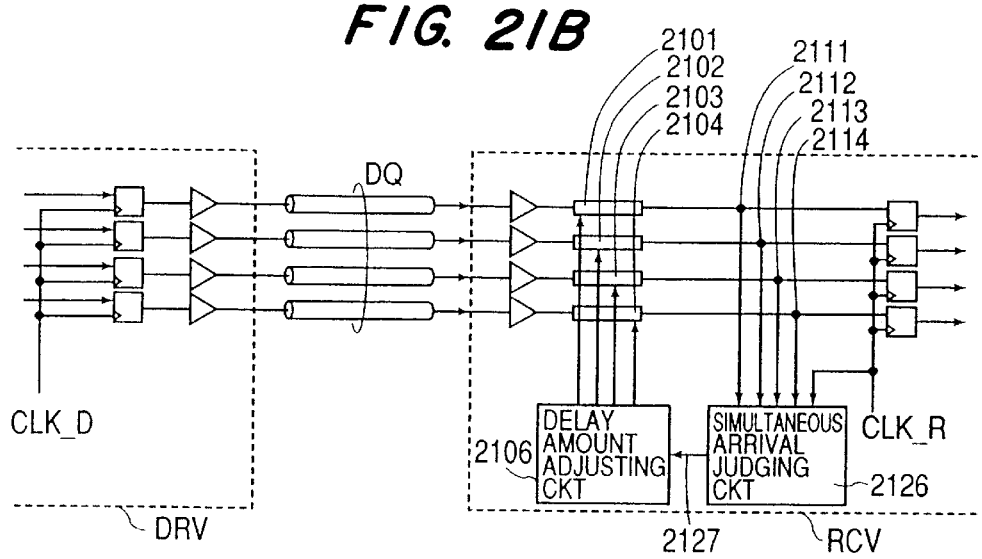

DATA TRANSMITTER

This is a continuation of application Ser. No. 09/646,010, filed Sep. 12, 2000 now U.S. Pat. No. 6,359,815.

BACKGROUND OF THE INVENTION

This invention relates to a data transmitter for transmitting parallel data; and, more particularly, the invention relates to a data transmitter suited for transmitting data at high speeds in a memory system.

PRIOR ART

In the devices for transmitting data at high speeds, the data propagation delay time through the transmission paths is increasing to such a degree that is no longer negligible relative to the data transmission period. A device that must transmit data at high speeds can be represented by a memory system which comprises a microprocessor (MPU), a memory controller LSI and a plurality of memory modules, and is used in a personal computer. Each memory module mounts a plurality of synchronous DRAMs (SDRAMs) which are memory chips. When data is to be read out in this memory system, the SDRAM on the memory module works as a driver for transmitting data, and the memory controller works as a receiver for receiving the data.

The memories at the same positions on the memory modules share a data signal wiring on a bus. In this case, the wiring length differs between a memory module and the memory controller LSI when the data is read out from the SDRAM on a memory module closer to the memory controller LSI and from the SDRAM on a memory module more distant from the memory controller LSI. When the memory controller LSI reads out data from the SDRAM of the distant memory module, therefore, the arrival of data is delayed by a difference in the propagation delay time between the two memory modules as compared to when the data is read out from the SDRAM of the closer memory module.

Thus, when the receiver receives the data by using a reference signal of a predetermined timing relative to the signals arriving at timings that differ depending on the positions of the modules, the effective time of the data decreases making it no longer possible to maintain a setup time for receiving data and a holding time.

This problem can be solved by, for example, a method disclosed in Japanese Patent Laid-Open No. 157030/1991. According to this method, the driver that produces data sends, together with data signals, reference signals for receiving the data to absorb differences in the transmission delay time.

FIGS. 3A and 3B schematically illustrate typical memory modules having a data bit width of 64 bits as used in the above memory system, wherein FIG. 3A shows a memory module mounting four SDRAMs of ×16 bit output, and FIG. 3B shows a memory module mounting 16 SDRAMs of ×4 bit output. Here, FIG. 3B shows only one surface of the memory module.

The two memory modules of FIGS. 3A and 3B employ a uniform pin arrangement, and have data signals DQi (i=0 to 63), signals CLKj (j=0 to 3) used as a reference for writing data from the memory controller LSI into the SDRAM, and reference signals DQSj (j=0 to 3) used for reading data from the SDRAM into the memory controller LSI, each of which is four in number. The data signal DQi consists of 64 bits and, hence, the reference signals CLKj and DQSj each receive 16 data signals as a reference.

Hereinafter, the reference signals CLK0 and DQS0 are used to write and read data signals DQ0 to DQ15 as a reference, respectively; the reference signals CLK1 and DQS1 are used to write and read data signals DQ16 to DQ31 as a reference, respectively; the reference signals CLK2 and DQS2 are used to write and read data signals DQ32 to DQ47 as a reference, respectively; and reference signals CLK3 and DQS3 are used to write and read data signals DQ48 to DQ63 as a reference, respectively.

Here, in the memory module of FIG. 3A, four SDRAMs are mounted and, hence, the reference signals and the corresponding 16 data signals are connected to the same SDRAM. in the memory module 6f FIG. 3B, on the other hand, 16 SDRAMs are mounted and, hence, the reference signals CLK1 are branched into four areas on the memory module to distribute signals to each of the SDRAMs. The reference signal DQSj is representatively used as a reference for receiving data of four chips from an SDRAM.

FIG. 4A illustrates, in a simplified manner, an example of a driver DRV on a module which transmits signals while bringing the data signals DQi (i=A, B, C) into phase with the reference signals CLK for receiving the data, and the receiver RCV receives the data by delaying the phase of the reference signals CLK by one-half period (T/2). FIG. 4B is a timing diagram of the relevant signals.

Here, reference numerals 401, 402 and 403 denote flip-flops for determining the output phases of the signals DQA, DQB, DQC, reference numerals 411, 412, 413 and 414 denote output buffers for the signals DQA, DQB, DQC, CLK, and reference numerals 421, 422, 423 and 424 denote signal wirings for connecting the driver to the receiver and comprise a bus between the memory module and the memory controller LSI. Reference numerals 431, 432, 433 and 434 denote input buffers for the signals in the receiver, and reference numerals 441, 442 and 443 denote flip-flops for receiving the transmitted data.

The driver having data signals DQi (i=A, B, C) and reference signals CLK to be transmitted may be in the form of, for example, a single chip as shown in FIG. 3A or it may be constituted by a plurality of different chips like signals DQS in FIG. 3B. In eith6r case, the difference in the length of the transmission paths to the memory modules can be absorbed by transmitting reference signals for receiving data simultaneously With the transmission of data signals as disclosed in Japanese Patent Laid-Open No. 157030/1991.

For this purpose, however, the wirings 421 to 424 for the data signals and reference signals must have an equal length, and their loads must be equalized. if the wirings having an equal length and an equal load have been realized between the data signals and the reference signals that are transmitted in parallel, the relationship of phase between the data signals DQA to DQC in the flip-flops 401 to 403 and the clock signals CLK in the driver DRV will be maintained so as to be relatively the same even after they have passed through the input buffers 431 to 434 in the receiver RCV as shown in the timing diagram of FIG. 4B.

Therefore, the reference signals and the data signals transmitted from the driver at the same timings arrive at the receiver all at the same timing irrespective of the wirings 421 to 424 between the driver and the receiver, i.e., irrespective of the lengths of the transmission paths between the memory controller LSI and the memory module. When the receiver receives the data using the reference signals, the setup time (tDS) 451 and the holding time (tDH) 452 can be maintained to a sufficient degree.

As another example, Japanese Patent Laid-open No. 75594/1993 discloses a parallel bit synchronizing system comprising a training data generating circuit and a selector for changing the normal data and the training data over to each other in response to a training mode signal on the data transmission side, a bit phase synchronizing circuit that operates in the training mode to automatically synchronize the phase among the bit data, and an inter-bit phase synchronizing circuit connected to the bit phase synchronizing circuit to automatically synchronize the phases among the bit data on the data receiving side.

According to the above first example in which the driver transmits the reference signals together with the data signals, however, there exists a region 501 on the printed board or on the memory module board where it is not allowed to lay wiring, as shown in FIG. 5A. Therefore, it often becomes difficult to maintain an equal length of the wirings for the reference signals CLK and the data signals DQA to DQC. Even if the wirings of an equal length could be realized, the presence of parasitic capacitance due to the wirings running in parallel with other wirings or crossing other wirings and the dispersion of processes among the chips make it difficult to uniformalize the characteristics of the input/output buffers and, hence, make it difficult to equalize the loads among the wirings. In such a case, the propagation delay time differs among the signal wirings, and even the signals transmitted in phase from the driver DRV do not necessarily arrive at the receiver RCV simultaneously.

In the example shown in FIG. 5A, the wiring 521 of the data signal DQA is longer than the other wirings, and a parasitic capacitance 522 is formed, causing the propagation delay time of the signal DQA to increase. As for the data signal DQC, further, the input capacity of the input buffer 533 in the receiver RCV is smaller than that of input buffers for other signals. In such a case, as shown in the timing d4lagram of FIG. 5B, the signal DQA arrives at the receiver at a delayed timing and the signal DQC arrives at the receiver at an advanced timing relative to the timing at which the signal DQB and the signal CLK arrive at the receiver. As a result, both the setup time (tDS) 551 and the holding time (tDH) 552 are shortened.

As shown in FIG. 3B, further, when the data signals DQi and reference signals DQSJ are formed by different chips, there will be an added dispersion to the delay times of the output buffers.

In the high-speed data transmission of a short period, the difference in the propagation delay time among the parallel data become no longer negligible, creating a problem in that the setup time for receiving the data and the holding time are not maintained, and the data is not normally transmitted.

According to the second example for synchronizing the parallel bits, the-data path differs between the training data generating circuit and the data generating circuit during normal operation. Therefore, even if the synchronism is established among the data signals, clock signals and data signals relying upon the training, a difference in the delay time occurs during the normal transmission of data.

SUMMARY OF THE INVENTION

The object of this invention is to provide a data transmitter which is capable of transmitting parallel data without error even when there is a difference in the lengths of paths among the parallel data wirings and in the load capacities inclusive of parasitic elements in the high-speed data transmission over a short period, overcoming the above problem.

In order to accomplish the above object according to this invention, the receiver for receiving parallel data is provided with a simultaneous arrival judging circuit that compares the phases of part or all of the received data. There is further provided a timing adjusting mechanism for adjusting the phases at a point of receiving data it the receiver based on the result of judgement of the simultaneous arrival judging circuit, so that the data signals simultaneously arrive at the receiver, thereby to maintain a setup time for receiving the data and a holding time. Here, the signals used as a reference for receiving the data may be transmitted from the driver to the receiver together with the data signals, or reference signals in the receiver may be used.

Here, the timing adjusting mechanism may be a circuit for varying the phases of the data or of the reference signals, or it may be a circuit for varying the driving force of the output buffers of the driver.

Further, in order to absorb the difference in the delay time among the signals dependent upon a sequence of data, the timing adjusting mechanism is so constituted as to vary the timing depending even upon the time series of the data bits that are transmitted.

Further, the timing adjusting mechanism can be provided in the driver chip, in the receiver chip, or in a chip formed between the driver chip and the receiver chip, and it is different from either the driver or the receiver.

In particular, parallel data of two or more bits transmitted by the driver and received by the receiver may be output from a plurality of different driver chips. As a reference signal for judging the simultaneous arrival at the receiver, it is desired to use a signal which is common among the above plurality of different driver chips.

BRIEF DESCRIPTION OF THE DRAWINGS

FIG. 2 is a perspective view illustrating a memory system to which there is applied a data transmitter of this invention;

FIG. 7 is a table of decoding logics of a DBS signal decoder circuit mounted on the memory module shown in FIG. 6;

FIG. 9 is a table illustrating definitions of CR and CW signals for specifying a chip of which the timing is to be adjusted;

FIG. 12 is a table illustrating the definitions of CUP and CDN signals for transmitting the judged result of simultaneous arrival;

FIGS. 19A and 19B are diagrams illustrating the concept of a procedure for adjusting the timings for writing the data and reading the data, respectively;

FIGS. 21A and 21B are schematic diagrams showing the process for judging the simultaneous arrival and for adjusting the timings on the receiver chip of a data transmitter according to a second embodiment of this invention;

DESCRIPTION OF THE PREFERRED EMBODIMENTS

A memory system according to a preferred embodiment of the invention will now be described.

FIG. 2 is a perspective view illustrating a simplified constitution of a memory system according to a first embodiment to which a data transmitter of the invention is applied. The memory system is constituted by a microprocessor (MPU) 201, a memory controller LSI 202, and memory modules (DIMM) 203 to 206.

To read out the data, synchronous DRAMs (SDRAMs) which are memory chips on the memory modules 203 to 206 work as drivers for transmitting the data, and the memory controller LSI 202 works as a receiver for receiving the data. In the embodiment shown in FIG. 2, the memory chips at the same positions on the memory modules, for example, the SDRAMs 210, 211, 212 and 213 share a data signal wiring 207 on the bus.

Here, the SDRAMs and the memory controller LSI are provided with a simultaneous arrival judging circuit and data input/output blocks 230, 233 including a timing adjusting mechanism to adjust the transmission or reception timings of the parallel data as will be described later. In FIG. 2, further, the MPU 201 and the memory controller LSI 202 are further provided with similar data input/output blocks 231, 232.

When the speed of data transmission between the MPU 201 and the memory controller LSI 202 is not limiting the speed of processing of the memory system, however, there may be employed memory controller LSI and conventional microprocessor not having the data input/output blocks 231, 232. Here, the fact is simply demonstrated that the invention can be applied even to the data transmission between the memory controller LSI 202 and the MPU 201. The data input/output blocks 231, 232 basically operate in the same manner as the data input/output blocks 230 and 233. Therefore, the following description deals with the data input/output blocks 230 and 233 provided for transmitting and receiving parallel data between the SDRAMs on the memory modules and the memory controller LSI.

Figure 3A:
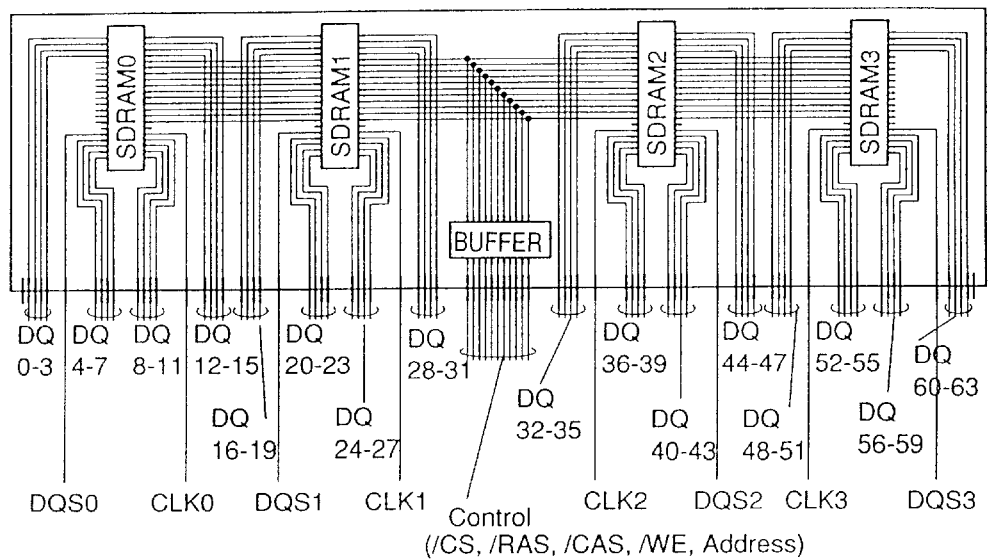
FIG. 3A is a schematic diagram illustrating a memory module used in a conventional memory system.
Figure 3B:
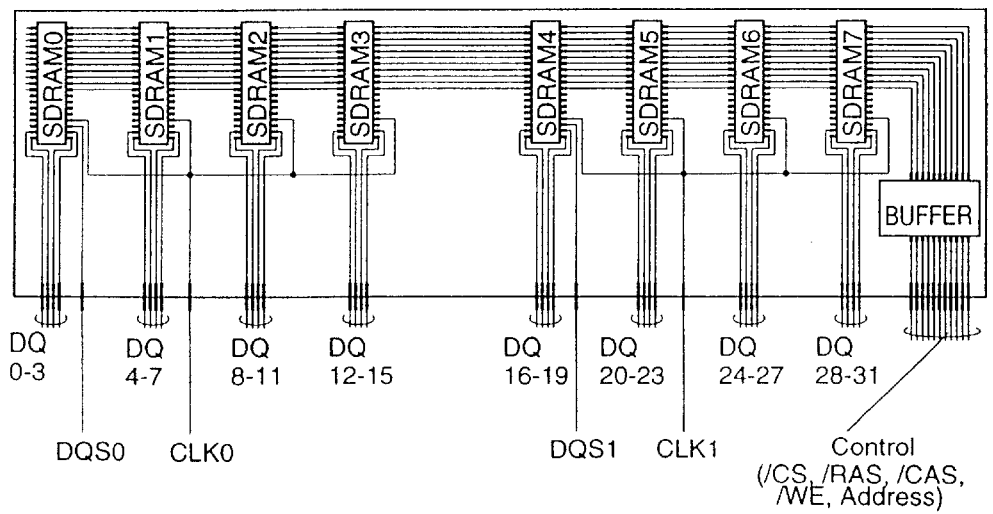
FIG. 3B is a timing diagram related thereto.
Figure 4A:
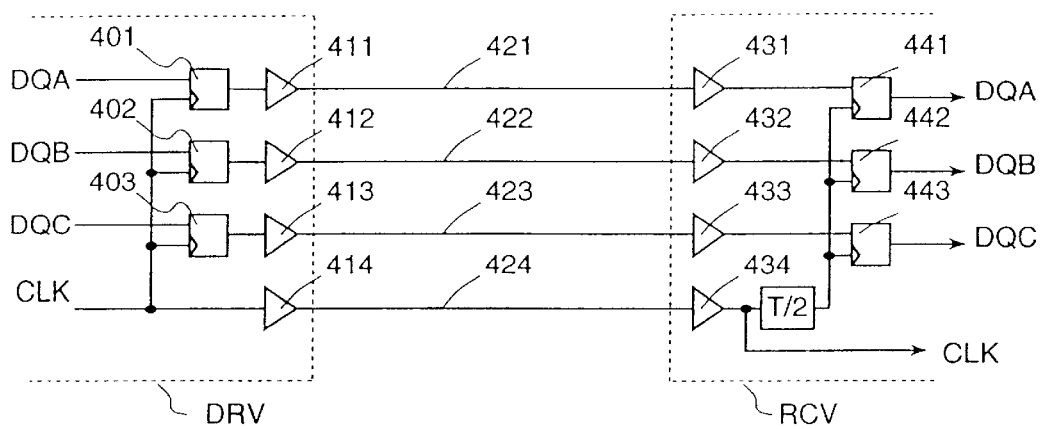
FIG. 4A is a schematic diagram which illustrates an example of a driven where no skew is occurring.
Figure 4B:
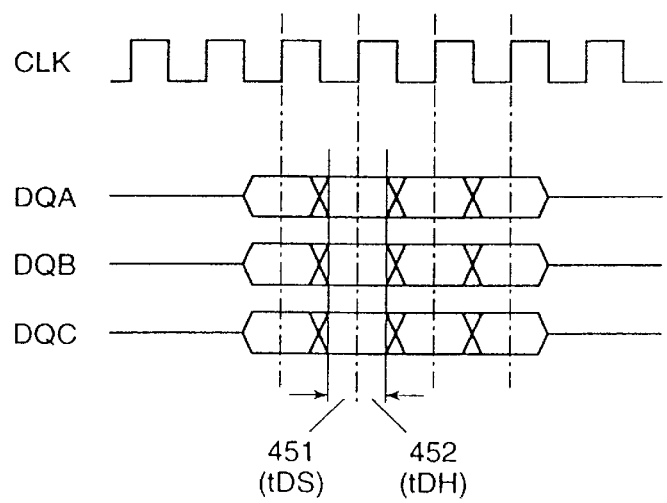
FIG. 4B is a timing diagram related thereto.
Figure 5A:
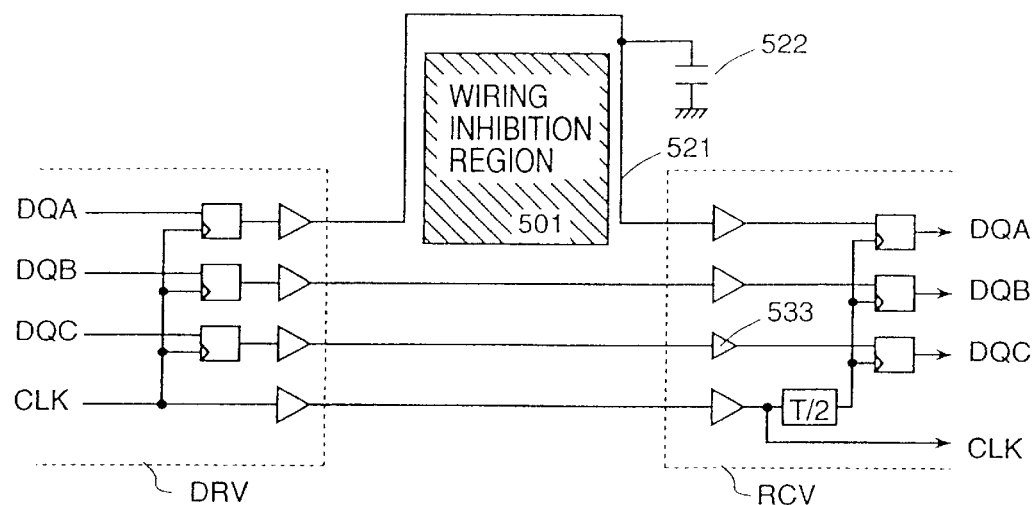
FIG. 5A is a schematic diagram which illustrates an example of a driver where skew is occurring since the wirings of an equal length and of an equal load are not formed.
Figure 5B:
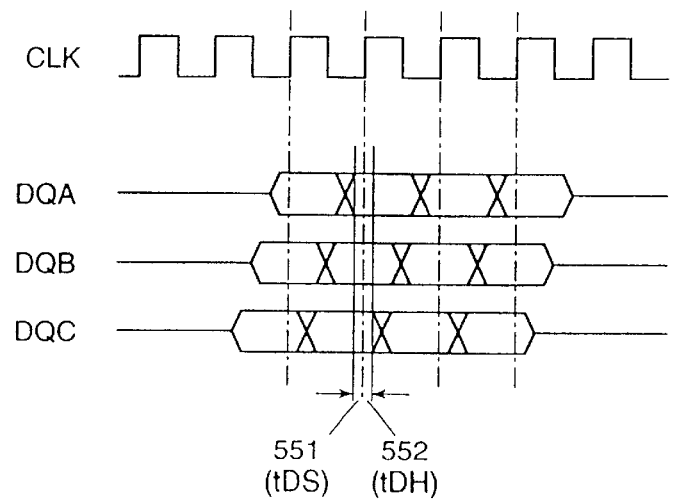
FIG. 5B is a timing diagram related thereto.
Figure 24A:
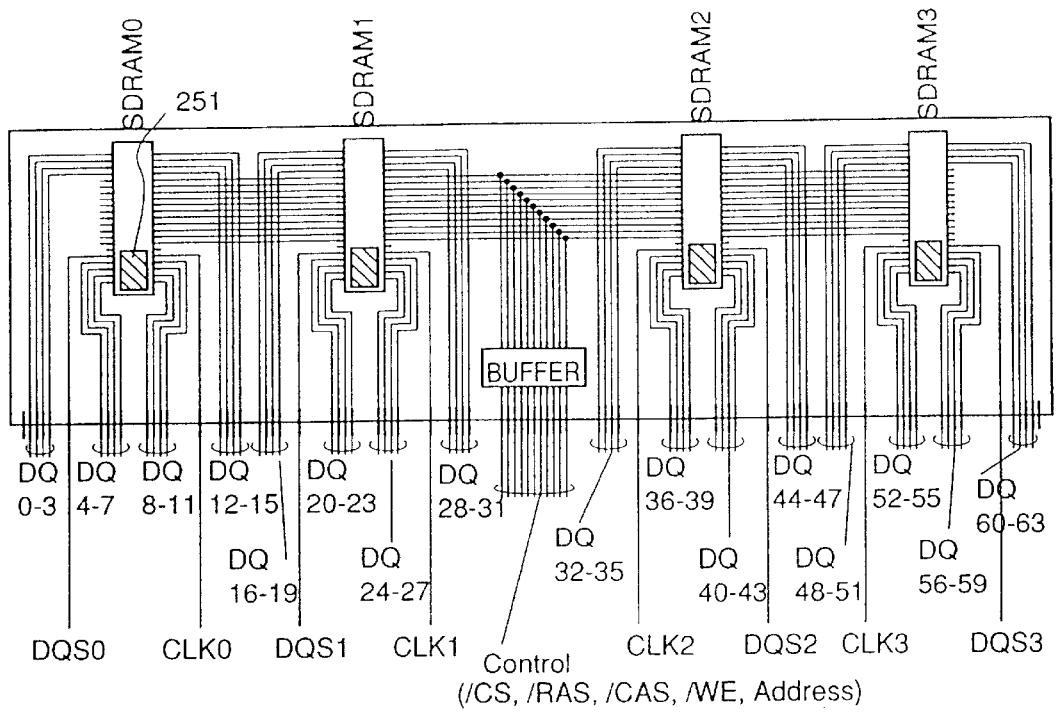
FIGS. 24A and 24B are schematic diagrams illustrating a memory module to which the invention is applied.
Figure 24B:
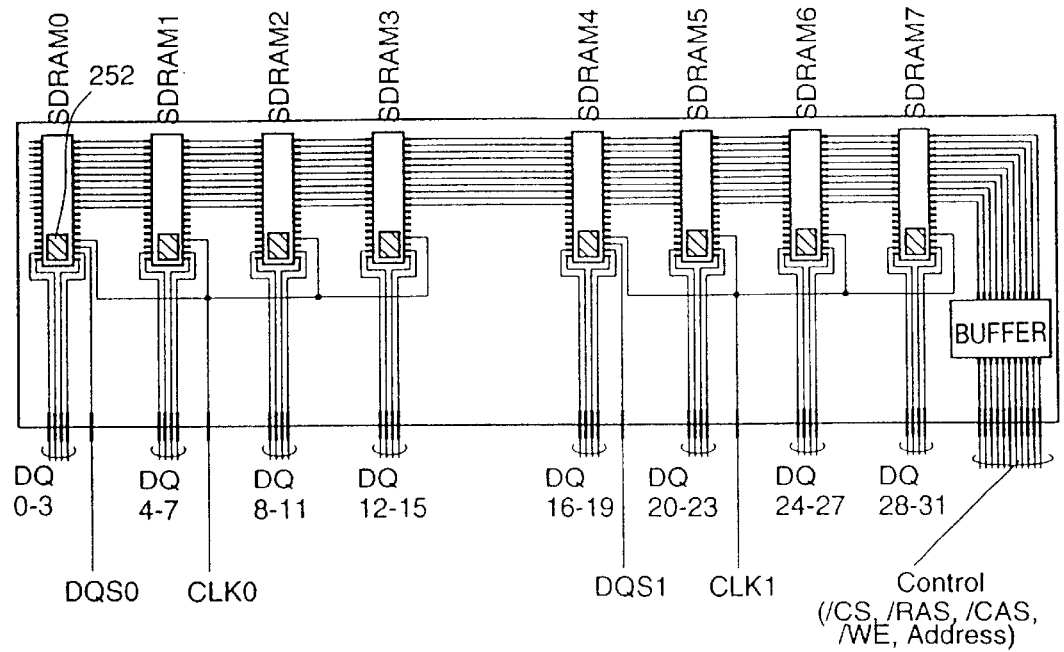

FIGS. 24A and 24B are diagrams schematically illustrating memory modules to which the invention is applied, wherein FIG. 24A illustrates a memory module mounting four SDRAMs of ×16 bit output, and FIG. 24B illustrates a memory module mounting 16 SDRAMs of ×4 bit output. In FIGS. 24A and 24B, the constituent portions which are the same as those shown in FIGS. 3A and 3B are denoted by the same reference numerals, but they will not be described in detail. That is, in order to adjust the transmission or reception timings of parallel data in the memory module of this embodiment, the memory chips contain a simultaneous arrival judging circuit and data input/output blocks 251 and 252 including the timing adjusting mechanism, which represent the main difference from the memory modules shown in FIGS. 3A and 3B. Here, the data input/output blocks 251, 252 correspond to the data input/output blocks 230 shown in FIG. 2.

The data transmitter according to the invention can be put into practice irrespective of the constitution of the memory module, and it will now be described in detail with reference to FIG. 6.

Figure 6:
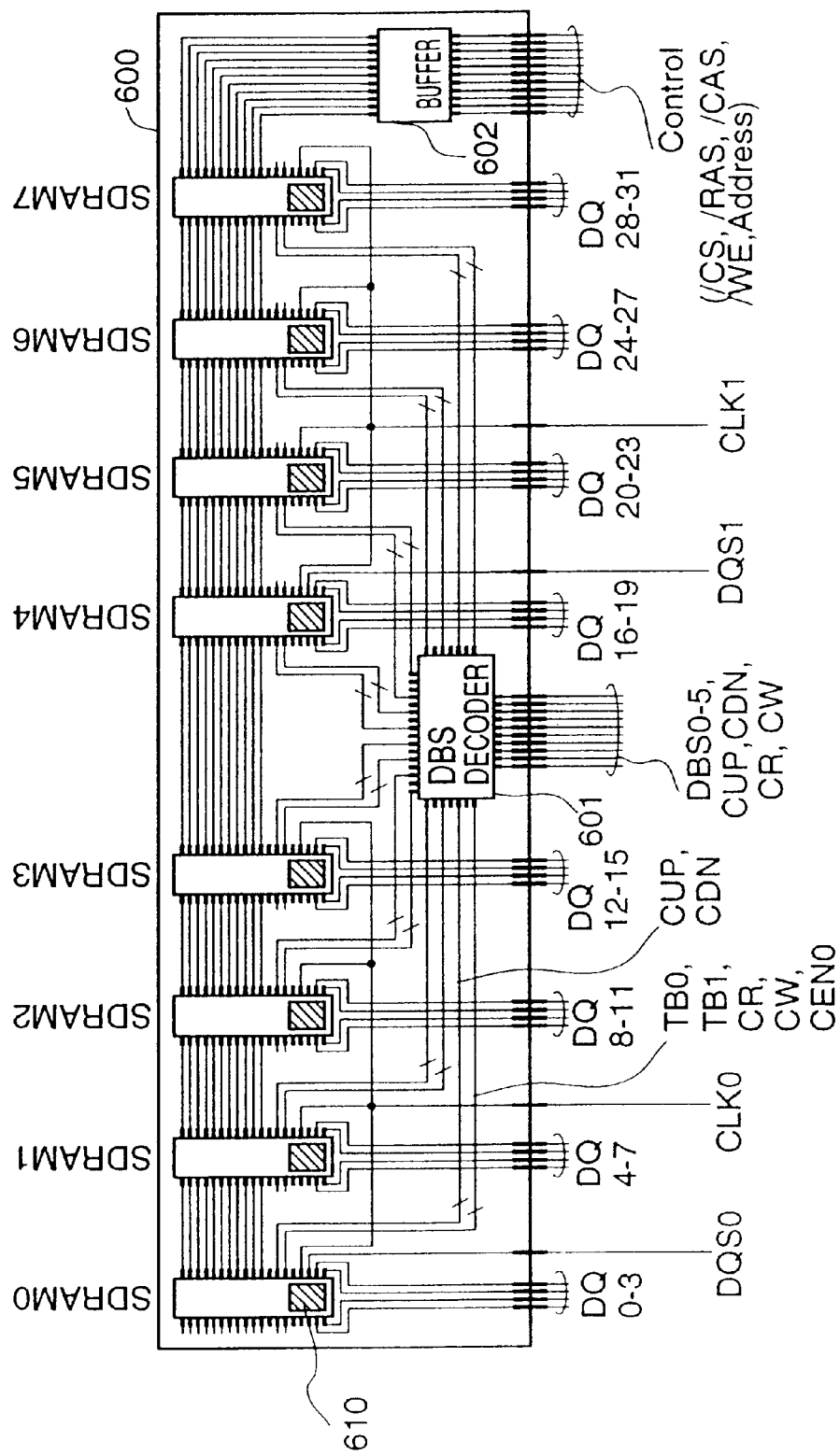
FIG. 6 is a schematic diagram illustrating a memory module using SDRAMs of ×4 bit output according to an embodiment of the invention.

FIG. 6 illustrates a memory module mounting 16 SDRAMs of ×4 bit output to which the invention is applied to transfer parallel data of 64 bits. The memory module 600 uses both surfaces of a memory module board, but FIG. 6 schematically shows the constitution on one surface only. If compared to FIG. 3B, the memory module 600 shown in FIG. 6 further includes a data bit selector (DBS) decoder circuit 601 for selecting data bits for adjusting the timing, and wiring for signals DBS1 (i=0 to 5), CUP, CDN, CR, CW, TB0, TB1 and CENj (j=0 to 5) to the SDRAMs. Further, each SDRAM further includes a data input/output block 610 including a simultaneous arrival judging circuit and a timing adjusting mechanism.

The DBS decoder circuit 601 decodes the signals DBS1. This offers functions for selecting a bit specified by the memory controller LSI out of the data signals of 64 bits, for selecting an SDRAM to which the signal is connected, and for outputting the signal as a bit signal TBi (i=0 to 1) selected by the SDRAM. The DBS decoder circuit 601 further has a function for connecting, to the selected SDRAM, the signals CUP and CDN that are received for adjusting the timing between the SDRAM and the memory controller LSI. Further, the signal CENj representing whether the SDRAM has been selected for adjusting the timing, is sent to each of the SDRAMs. The DBS decoder circuit 601 may be formed as an independent LSI as shown br may be incorporated in the buffer LSI 602 for control address signals.

A constitution of the DBS decoder circuit chip for realizing these functions will now be described with reference to FIGS. 7 and 8. FIG. 7 is a DBS1 signal decoding table. The DBS1 signal decoding table shows which pins among the DQ output pins 0 to 3 of which SDRAM correspond to the 64 data signals DQ0 to DQ63 that correspond to the DQ pin Nos. 0 to 63 of the memory module DIMM. In the example shown in FIG. 7, for example, DBS1=000000 stands for a signal DQ0 among 64 data signals DQ0 to DQ63, and corresponds to the DQ output pin 0 among the DQ output pins 0 to 3 in the SDRAM0. Similarly, DBS1 111111 stands for a signal D063, and corresponds to the DQ output pin 3 of the SDRAM15 that is not shown on the back surface of the memory module board.

Figure 8:
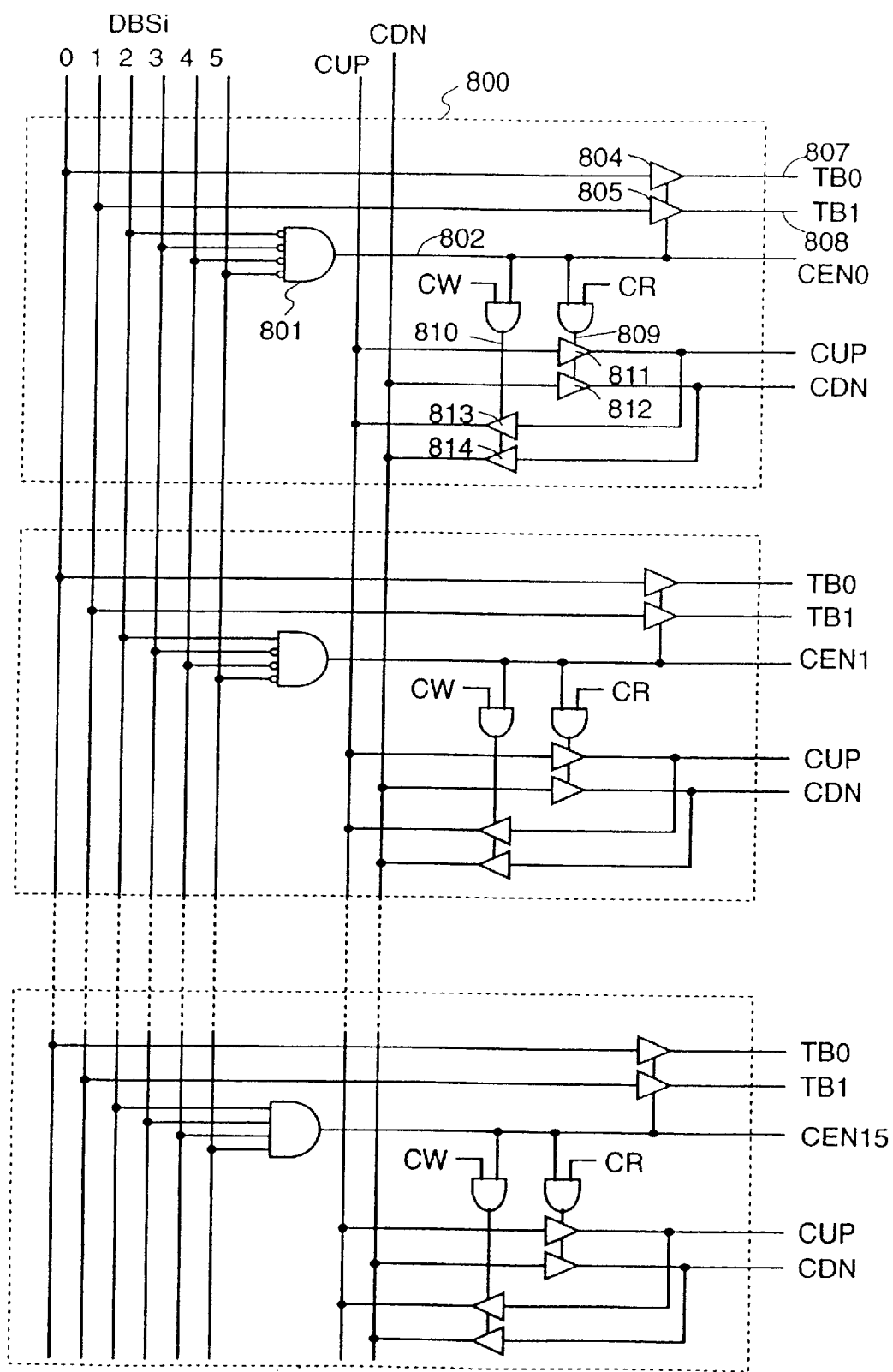
FIG. 8 is a schematic circuit diagram illustrating a circuit for realizing the decoding logics shown in FIG. 7.

FIG. 8 illustrates a concrete constitution of the DBS decoder circuit for realizing the function of the decoding table of FIG. 7. In FIG. 8, a block denoted by reference numeral 800 is provided for controlling the communication between the SDRAM0 and the memory controller LSI that are not shown. Described below is the circuit of the block 800. The DBS decoder circuits for the SDRAMs 1 to 15 can quite similarly be constituted by the blocks represented by broken lines.

In accordance with the decoding table of FIG. 7, the SDRAM0 and the memory controller LSI communicate with each other when the higher four bits DBS2 to DBS5 of the DBS1 signal are all 0. By providing a logic element 801 for these four bits, therefore, a signal CEN0 (802) for selecting the SDRAM0 can be formed. The lower two bits DBS0 and DBS1 of the DBS1 signal select the DQ output pin in the SDRAM0 and are, hence, output as DQ output pin selection signals TB0 (807) and TB1 (808) via 3-state buffers 804 and 805 that are enabled by the signal CEN0.

The timing adjusting signals CUP and CDN are bidirectional signals and are mutually connected to each other through the 3-state buffers 811 to 814 using, as control signals 809 and 810, the logical products of signals CR, CW output from the memory controller LSI to represent a chip for which the timing is to be adjusted and the signal CEN0. Here, the meanings of the signals CR, CW, representing a chip for which the timing is to be adjusted, can be defined as shown in FIG. 9. In this embodiment, further, the signals CR and CW are also used in the SDRAMs and are, hence, fed to all SDRAMs through buffers that are not shown.

Figure 10:
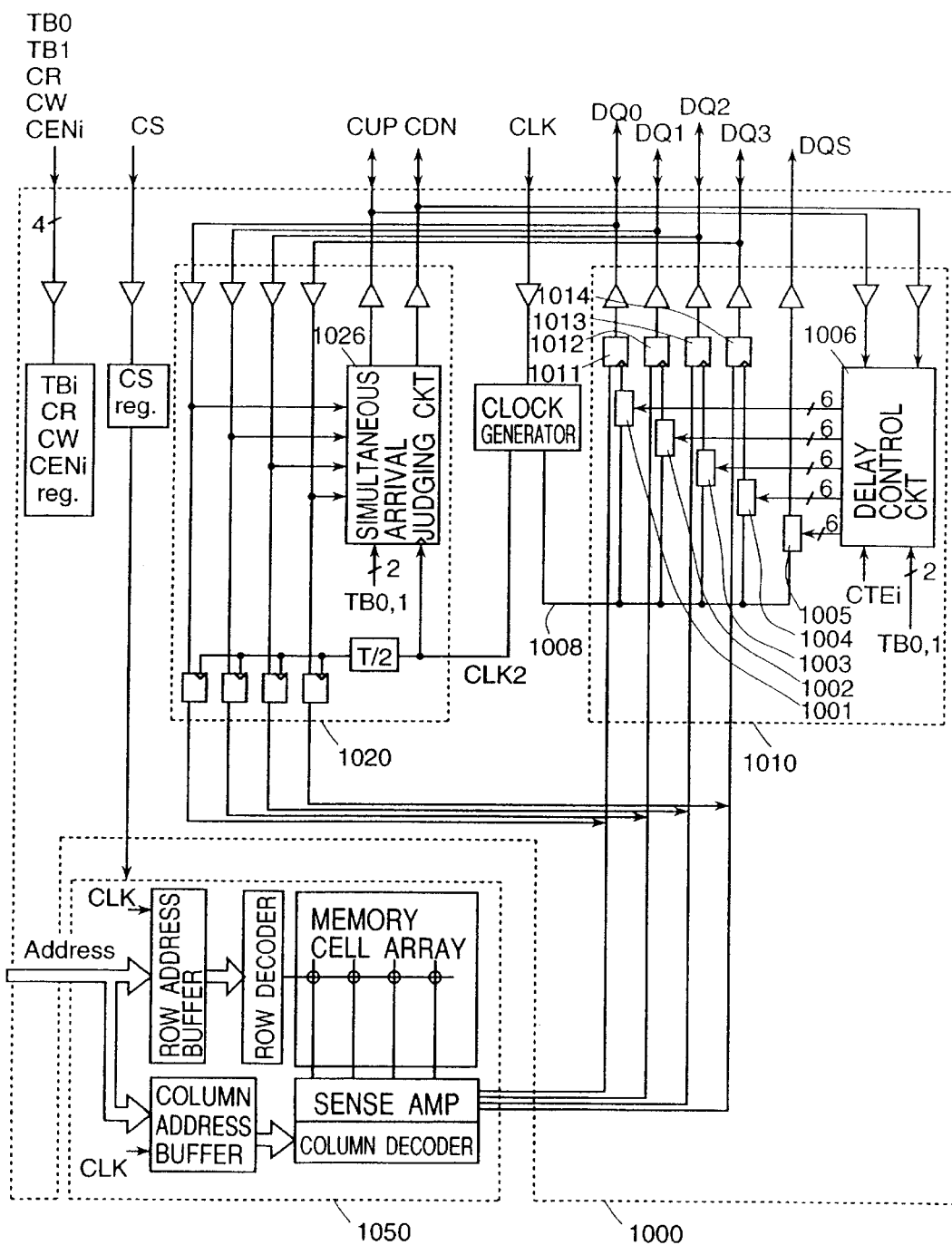
FIG. 10 is a block diagram of an embodiment in which the data transmitter of the invention is applied to the memory of ×4 bit constitution.
Figure 11:
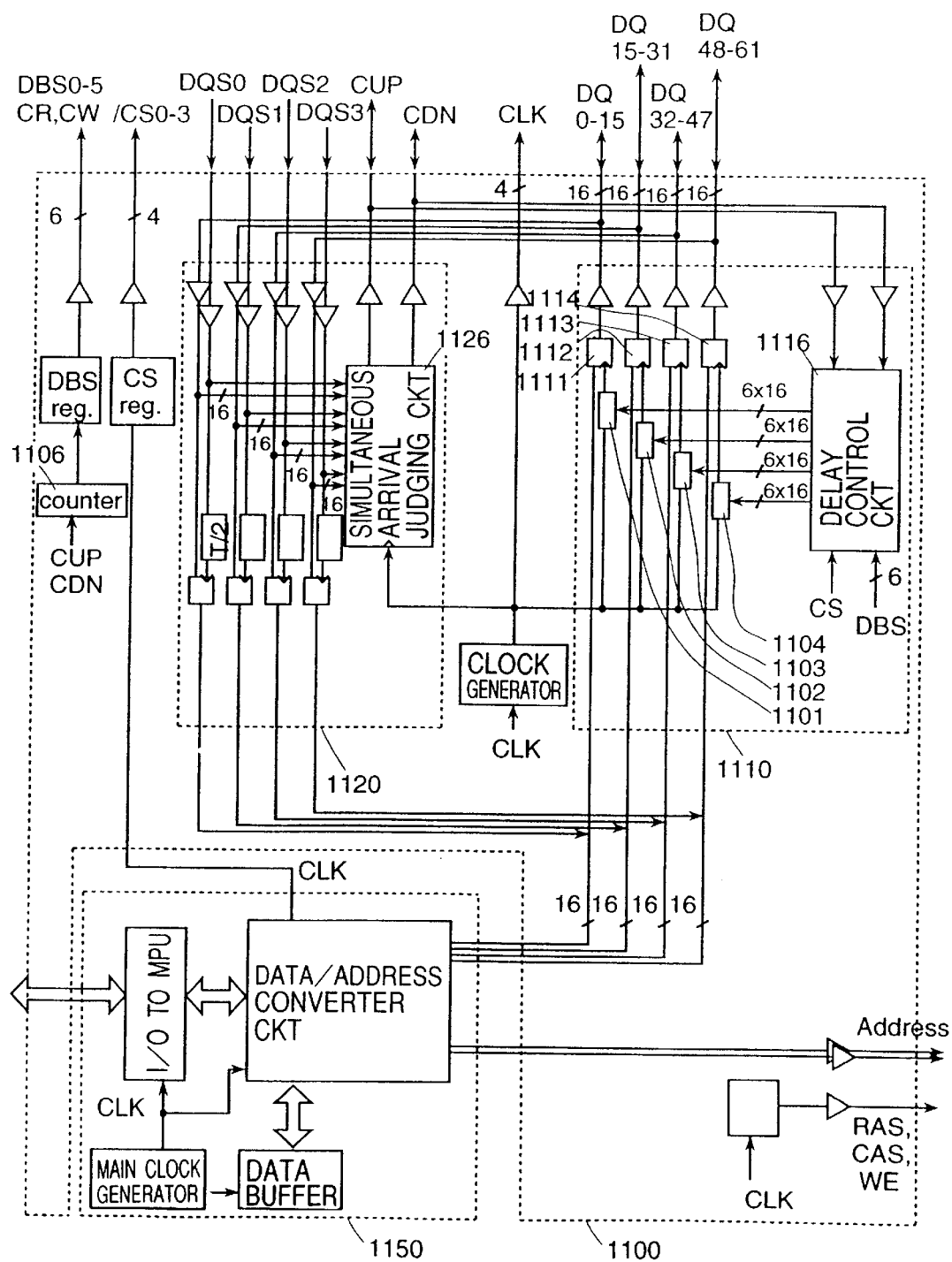
FIG. 11 is a block diagram of an embodiment in which the data transmitter of the invention is applied to the memory controller LSI.

FIG. 10 is a block diagram of the SDRAM of the ×4 bit output to which the invention is applied, and FIG. 11 is a block diagram of the memory controller LSI to which the invention is applied. The SDRAM shown in FIG. 10 is constituted by a DRAM core unit 1050, and an input/output block 1000 that includes an input block 1020 and an output block 1010. Here, the operation of the DRAM core will be briefly described.

The DRAM core unit 1050 includes a row address buffer, a row decoder, a column address buffer, a column decoder, a sense amplifier and a memory cell array, and it receives an address signal from an external unit through the data input/output block 1000 in the operation for reading out the content from the memory. First, the row address signal is amplified through the row address buffer, and a row position on the memory cell array corresponding to the row address is activated by the row decoder. Similarly, the column address signal is amplified through the column address buffer, and a column position on the memory cell array corresponding to the column address is selected by the column decoder. The content of the memory cell at an intersecting point of the row and column addresses is sent to the data output block 1010 through the sense amplifier.

In the operation for writing data into the memory in the DRAM core unit 1050, too, the positions on the memory cell array corresponding to the row address and the column address are selected by the row decoder and the column decoder. Thereafter, the data input through the data input block 1120 is written into the memory cell at the intersecting point of the row and column addresses through the sense amplifier.

The memory controller LSI in FIG. 11 is constituted by a memory controller core unit 1150, and a data input/output block 1100 including a data output block 1110 and a data input block 1120. The memory controller core unit 1150 includes an I/O interface to MPU, a data/address converter circuit, a main clock generator and a data buffer. Here, the operation of the memory controller core unit 1150 will be briefly described. When the MPU writes and reads a memory value corresponding to a given address through the memory controller LSI, the memory controller core unit 1150 operates as described below.

An address specified by the MPU through the data input/output block 1100 and an instruction are received by the I/O interface to MPU, are interpreted through the data/address converter circuit, and are converted into a corresponding address on the memory system. By using the thus converted address, the memory module is specified, the address is specified, and the reading/writing timing is specified, and the control signals are output through the data input/output block 1100. At the same time, the data signals are output through the data output block 1110.

To read out the data, the control signals are output and the data is transmitted from the memory after the passage of a specified period of time. The data is received through the data input block 1120, and the data that is read out is transmitted to the MPU through the data/address converter circuit and I/O interface to MPU.

The buffer for data signals in the memory controller core unit 1150 is provided for executing the reading/writing operation at a high speed and for adjusting the timings for transmitting and receiving data.

In the embodiment of FIGS. 10 and 11, further, the input/output blocks 1000 and 1100 of the SDRAM and memory controller LSI are further provided with the simultaneous arrival adjusting circuit and the timing adjusting circuit which comprises a delay amount adjusting circuit and a variable delay circuit. The embodiment will now be described excluding the core unit in the following order (1) to (3). (1) The SDRAM, input signals and output signals of the memory controller LSI and the functions of the major circuit blocks will be described. (2) The operations will be individually described by using detailed circuit diagrams of the major circuit blocks. (3) The adjustment of timings will be concretely described by using a timing diagram o major signals.

First, described below with reference to FIG. 10 are the input signals and output signals of the SDRAM, and the functions of the major circuit blocks in the data input/output block 1000. The input signals TB0 and TB1 are the signals formed by decoding the signals DBS1 (i=0 to 5) output from the memory controller LSI through the DBS decoder circuit, and a DQ signal pin of the SDRAM of which the timing is to be controlled is represented by a combination of the two signals as shown in FIG. 7.

The input signals CR, CW are those that are formed by inputting the signals CR, CW output from the memory controller LSI through buffers in the DBS decoder circuit. Here, the signal CR="1" represents a mode for adjusting so that the data output from the SDRAMs simultaneously arrive at the memory controller LSI, and the signal CW "1" represents a mode for adjusting so that the data output from the memory controller LSI will simultaneously arrive at the SDRAMs. Examples of assigned logic values of signals CR and CW are shown in FIG. 9.

The signal CENi (i=0 to 15) represents the DQ signal indicating which SDRAM has been selected for adjusting the timing.

Further, the signals CUP and CDN represent the result of phase comparison by the simultaneous arrival judging circuit. In the case of the signal CR="1", the register storing the delay amount in the delay amount adjusting circuit 1006 in the SDRAM is increased or decreased by using signals CUP, CDN sent from the memory controller LSI to change the delay amounts in the variable delay circuits 1001 to 1005, thereby to adjust the timings for outputting the data. Examples of assigned logical values of the signals CUP and CDN are shown in FIG. 12.

The timings for outputting the data in FIG. 10 are adjusted by changing, by using the variable delay circuits 1001 to 1005, the timings of the clock signals 1008 for operating the flip-flop circuits 1011 to 1014 in the final stage for determining the phase at the time when the data is being output. In this embodiment, the delay amount of the variable delay circuit of the SDRAM is adjusted by 6 bits, i.e., in 64 steps. This means that when the data is transmitted at a speed, for example, corresponding to a frequency of 200 MHz, and a maximum delay adjusting amount of the variable delay circuit is 5 ns which is equivalent to one period, the amount of delay adjustment in one step becomes about 78 ps. In the foregoing the operation of the data output block 1010 was described.

In the data input block 1020, on the other hand, when the signal is CW="1", the data signal sent from the memory controller LSI and the CLK which is the reference signal are compared for their phases by the simultaneous arrival judging circuit 1026, and the results of comparison are sent as signals CUP and CDN to the memory controller LSI.

Next, described below with reference to FIG. 11 are signals input to, and output from, the memory controller LSI and the functions of the major circuit blocks in the data input/output block 1100. The signals DBS1 (i=0 to 5) are used for judging the Simultaneous arrival and for selecting a data signal of which the timing is to be adjusted. In this embodiment, as will be described later, the timings are successively adjusted bit by bit from the memory module DIMM0 to the memory module DIMM3 and from the data signal DQ0 to the data signal DQ63, and the signals DBS1 are formed by a counter circuit 1106 that generates signals in this order.

The signals CR and CW represent which output timing be adjusted between the SDRAM and the memory controller LSI.

The signals/CSi (i=0 to 3) are used for selecting the memory module, and one memory module is exclusively selected out of the four. Only this memory module selected by the signal is operated and adjusted for its timing.

The signals DQSi (i=0 to 3) are the signals transmitted from the SDRAM, together with the data signals, as reference signals for receiving the data signals. Here, the reference signals DQS0, DQS1, DQS2 and DQS3 serve as references for receiving data signals DQ0 to DQ15, DQ16 to DQ31, DQ32 to DQ47, DQ48 to DQ63.

In the case of the signal CR="1", the reference signal DQSi and the data signal DQj are compared for their phases for every pair of signals successively by the simultaneous arrival judging circuit 1126 in the data input block 1120. According to the assignment of logical values shown in FIG. 12, the simultaneous arrival judging circuit 1126 sends the results of the phase comparison as signals CUP, CDN to the SDRAM. Upon making reference to the results, the SDRAM adjusts the timings.

In the case of the signal CW="1", on the other hand, the signals CUP, CDN transmitted from the SDRAM are received by the data output block 1110, and the amount in the delay amount register in the delay amount adjusting circuit 1116 is increased or decreased to adjust the timings for outputting the clocks from the variable delay circuits 1101 to 1104. In the memory controller LSI, too, the variable delay circuits are adjusted by 6 bits in 64 steps like in the SDRAMs. The variable delay circuits 1101 to 1104 and the flip-flops 1111 to 1114 for controlling the phases shown in FIG. 11, were described as being grouped into units of 16 bits. Here, it is presumed that the variable delay circuits of 6 bits are connected to all clock inputs of 64 bits of the data signals.

In this embodiment, it will be understood that the timing adjusting mechanism for uniformalizing the phases of the parallel bits at a node for receiving the data in the receiver is constituted by the delay amount adjusting circuit and by the variable delay circuit.

Figure 13:
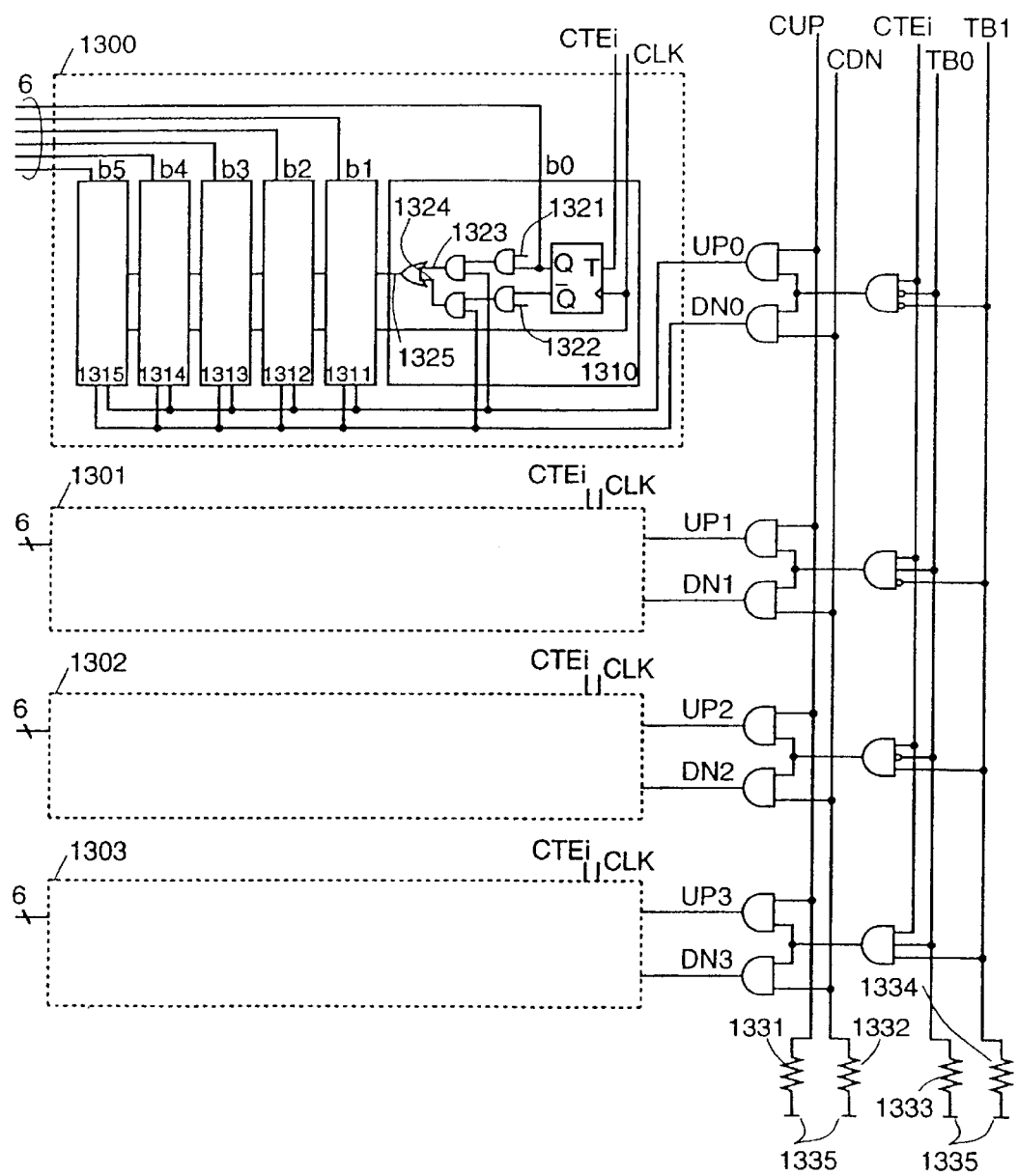
FIG. 13 is a schematic diagram illustrating a delay amount adjusting circuit in the memory.

FIG. 13 illustrates the constitution of the delay amount adjusting circuit 1006 in the SDRAM which does not produce the DQS signal. In this embodiment, the delay amount adjusting circuit 1006 is constituted as a binary up-down counter which holds the delay amount in the delay amount storage registers 1300 to 1303 of 6 bits, the amounts being added up or subtracted by the signals CUP, CDN. Here, the circuit block 1300 is a delay amount storage register for the signals DQ0. Similarly, the circuit blocks 1301, 1302 and 1303 Are delay amount storage registers for the signals DQ1, DQ2 and DQ3.

In the signal DQ0, LSB (least significant bit)—MSB (most significant bit) of the register correspond to 1310 to 1315, respectively. The delay amount storage registers 1301 to 1303, too, can be constituted similarly to the delay amount storage register 1300, and their internal structures are not described here.

The signal CTEi indicates that the data signal on the SDRAM is now going to be adjusted for its timing. For example, the signal CTEI can be formed as CTEi=CR·CS·CENi by using the signals CR, CS and CENi. In the case of the signal CTEi="1", an output data signal is selected to be controlled for its timing by the signals TB0 and TB1.

For example, in the case of the signal TB0=TB1="0", the data signal DQ0 of the SDRAM is selected to be controlled for its timing. In this case, among the signals UPi, DNi (i=0 to 3), the signals UP0 and DN0 only are connected to the signal wirings CUP, CDN. Therefore, the amount of the delay amount storage register of data signal DQ0 is increased or decreased by the signal CUP="1" or by the signal CDN="1" upon the rise of the clock signal CLK. Here, resistors 1331 to 1334 are used for weak connection to ground potential 1335 so that an intermediate voltage will not be assumed when the signals TB0, TB1, CUP and CDN have not been selected.

In this embodiment, the up-down counter is constituted by T-type flip-flops, the wirings 1321 and 1322 in the block 1310 are connected to the signals CTEi, and wirings corresponding to the wirings 1321 and 1322 in the blocks 1311 to 1315 are connected to the wirings corresponding to the wirings 1323 and 1324 in the block which is lower by one bit. Further, the T-inputs of the T-type flip-flops in the blocks 1311 to 1315 are connected to the wiring corresponding to the wiring 1325 in the block lower by one bit.

Figure 14:
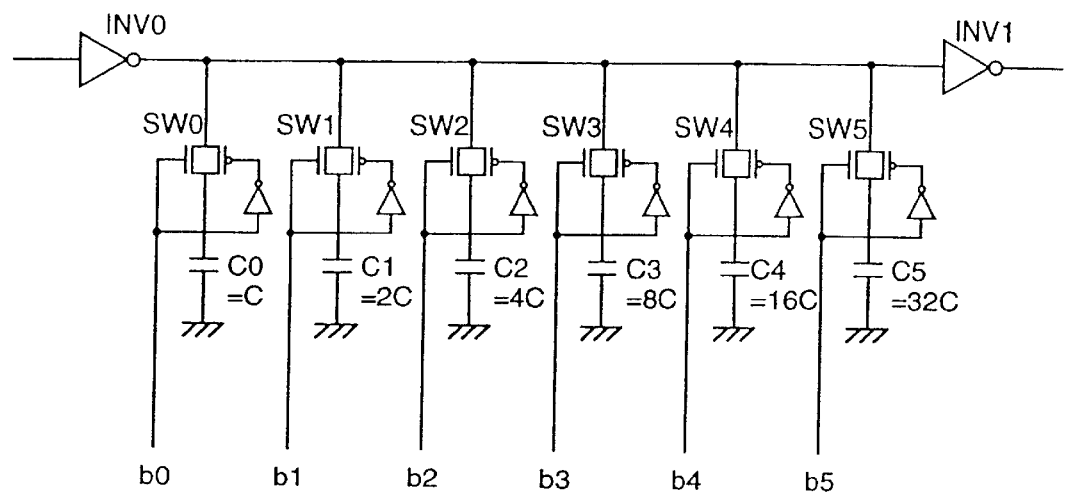
FIG. 14 is a schematic diagram illustrating variable delay circuits in the memory.

FIG. 14 illustrates the constitution of the variable delay circuit capable of adjusting the timings relying On the delay amount adjusting circuit of FIG. 13. In this variable delay circuit, capacitors C0 to C5, having capacities different from each other by two times, are connected as loads via switching MOS transistors between the inverters INV0 and INV1. By opening and closing these MOS switches SW0 to SW5 based on values b0 to b5 set to the delay amount storage registers, the delay times from the inverter INV0 toward the inverter INV1 can be monotonously changed in 64 steps.

For example, when the values b0 to b5 of the register are all "0", the MOS switches SW0 to SW5 are all rendered nonconductive, and the capacity to be driven by the inverter INV0 is only the gate capacity of the inverter INV1 of the next stage, whereby the delay time t0 between the inverters INV0 and INV1 becomes the shortest.

When the values b0 to b5 of the registers are all "1", on the other hand, the MOS switches SW0 to SW5 are all rendered conductive, and the capacity to be driven by the inverter INV0 becomes the sum (C0+C1+C2+C3+C4+C5) of the six capacitors connected to the gate capacity of the inverter INV1 of the next stage through the MOS switches. Accordingly, if the delay time due to the capacity C0 is Δt, then, the delay time between the inverters INV0 and INV1 becomes a maximum of t63=t0+63Δt.

Figure 15:
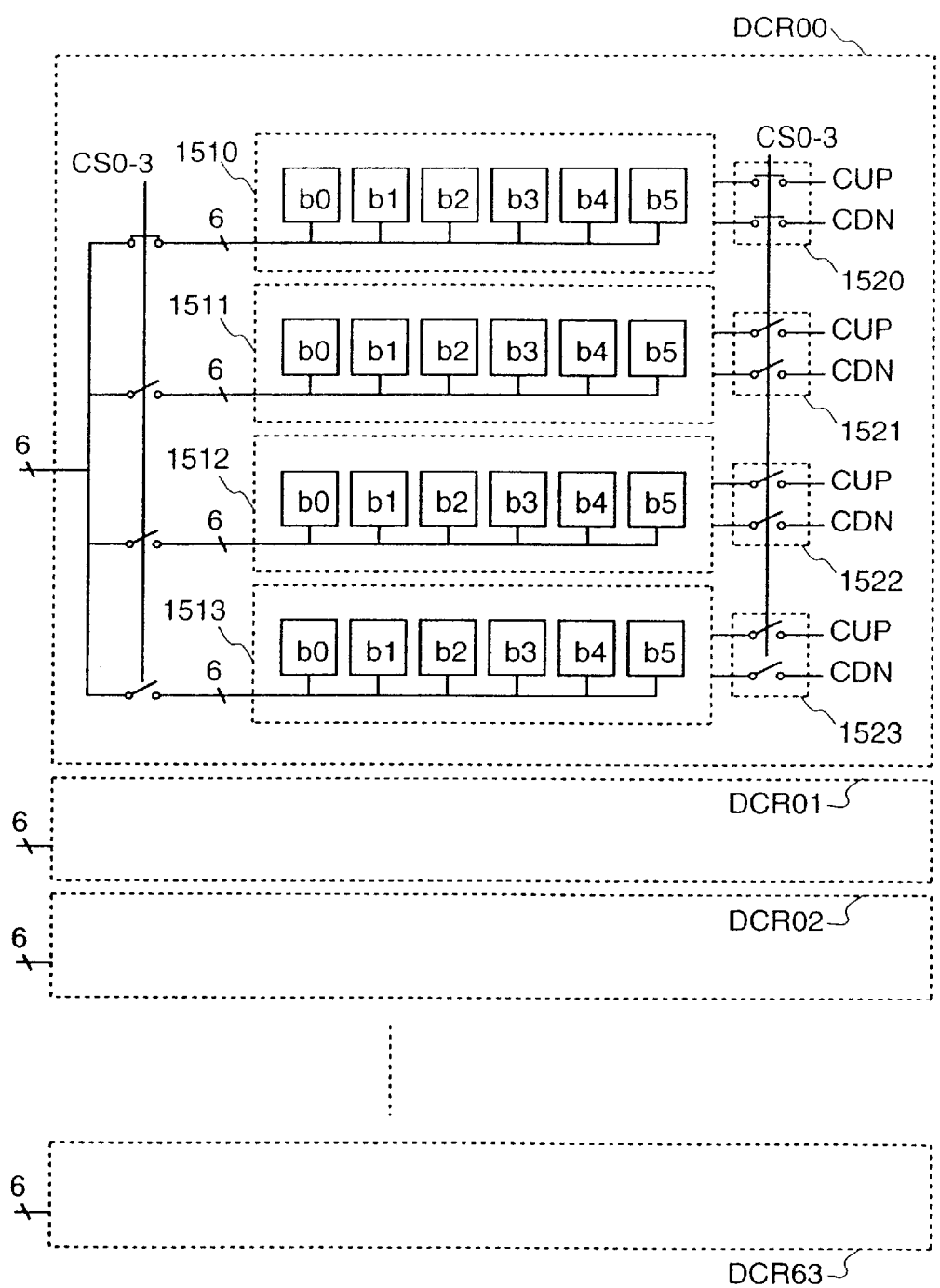
FIG. 15 is a schematic diagram illustrating delay amount adjusting circuits in the memory controller LSI.

FIG. 15 illustrates an example of the delay amount adjusting circuit 1116 in the memory controller LSI. The data signals DQ0 to DQ63 are constituted as the repetition of the same circuit. In FIG. 15, therefore, the internal structure is shown in a simplified manner only for the delay amount adjusting circuit DCR00 for the data signal DQ0, but the internal structures are not shown for the delay amount adjusting circuits DCR01 to DCR63 for other-data signals DQ01 to DQ63. The blocks 1510, 1511, 1512 and 1513 are delay amount storage registers for storing the delay amounts for the memory modules DIMM0, DIMM1, DIMM2 and DIMM3. The delay amount storage registers 1510, 1511, 1512 and 1513 are used for adjusting the delay of the data signal DQ0 corresponding to the positions of the memory modules. Similarly, for adjusting the delay of the data signals DQ1, DQ2, . . . , delay amount storage registers are provided in correspondence with the positions of the memory modules that are not shown.

The data signals DQi transmitted from the memory controller LSI are written into the SDRAM mounted on any one of the four memory module (DIMM) slots. Therefore, the memory controller LSI possesses four delay amount storage registers 1510 to 1513 corresponding to a DIMM slot for one data signal. In FIG. 15, the 6-bit binary up-down counter circuits 1510 to 1513 corresponding to the delay amount storage registers 1300 of FIG. 13 are represented as boxes b0 to b5. To change the register value, first, the data signals DQ0 to DQ63 are selected by the signals DBS0 to DBS5 according to the DBS1 signal decoding table shown in FIG. 7 and, then, the MOS switches 1520 to 1523 are opened and closed by the signals CSi to select a register corresponding to the DIMM slot. Thus, the memory module and the data signal DQ are selected, and the register value is increased or decreased bit by bit upon receipt of the signals CUP, CDN from the SDRAM.

Further, the variable delay circuits 1101 to 1104 shown in FIG. 11 make reference to the delay amounts b0 to b5 of the DIMM slot selected by the signal CSi. The variable delay circuits 1101 to 1104 in the memory controller LSI may be those constituted as shown in FIG. 14 similarly to the SDRAM.

In this embodiment, the number of the delay amount storage register sets is the "number of signals for adjusting the timings"×"number of chips for receiving the transmitted signals". For example, the SDRAM that does not produce the reference signal DQS transmits data signals of four bits which are received by the memory controller LSI only. Therefore, the delay amount storage register sets of 4×1=4 sets are possessed. On the other hand, the memory controller LSI transmits data signals of 64 bits which are received by the SDRAMs mounted on the zero-th to third memory modules and, hence, has the delay amount storage register sets of 64×4=256 sets.

Further, when the data is to be fetched not only when the reference signal is rising but also when the reference signal is breaking, it is desired to provide another delay amount storage register set for the rise and for the break, respectively. In particular, when the output buffer circuit of the final stage is to be constituted in CMOS, the amounts of current supplied to the PMOS transistor and to the NMOS transistor and the temperature characteristics often lack symmetry, and the waveforms do not become completely symmetrical depending upon the rise and break of the reference signal.

Though the precision is deteriorated, an increase in the number of the delay quantity storage register sets can be suppressed by determining the delay amount by averaging the register values that are present when the reference signal rises and breaks.

Further, a difference in the delay time often occurs among the signals due to a fluctuation in the power source voltage caused by the simultaneous operation of the output buffer circuits. The difference in the delay time stems from the fluctuation in the power source voltage caused when a current that greatly changes with the passage of time is supplied by the output buffer to the inductance component of a power source pin of a package. The difference in the delay time also occurs depending on the logic value output in the past even when the data signal is not sufficiently set during the transmission period.

In order to decrease the difference in the delay time that occurs due to the past data sequence, for example, the output logic value of the previous period is compared with a logic value output therefrom, the delay quantity storage registers are provided to correspond to the three states of logical change "0"→"1", logical change "1"→"0" and no logical change. The data series corresponding to them are transmitted and received, and their simultaneous arrival is judged to set the register values.

Even the difference in the delay time among the signals, due not only to the past signal sequence but also to the mutual coupling among the signal wirings on the package and on the board, can be decreased by setting the delay register values by taking logical changes among the neighboring signals of the same time into consideration.

Figure 16:
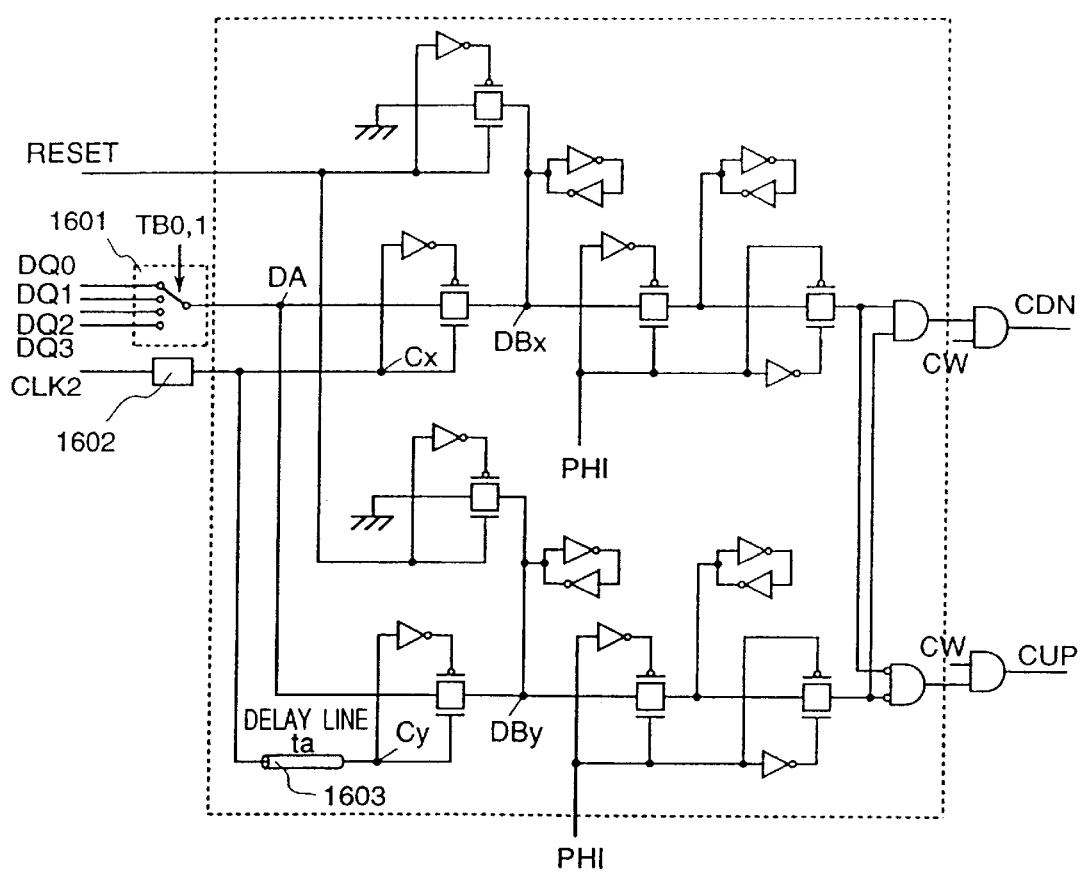
FIG. 16 is a schematic diagram illustrating a simultaneous arrival judging circuit in the memory.

FIG. 16 is a circuit diagram illustrating an example of the simultaneous arrival judging circuit 1026 in the SDRAM shown in FIG. 10. The reference of judgement is based on a signal CLK2 obtained by dividing into two the frequency of the signals CLK, and the simultaneous arrival with a data signal is judged each time. The data signal that is to be judged for its simultaneous arrival with the signal CLK2 is a bit among the data signals DQ0 to DQ3 selected by the selector 1601 by using bit selection signals TB0, TB1. Referring to the decoding table shown in FIG. 7, when, for example, the signals TB0 and TB1 are TB0="1" and TB1="0", the signal DQ1 becomes the data signal that is to be compared. To correctly judge the simultaneous arrival of the reference signal and the data signal, a delay circuit 1602 nearly equivalent to the delay time of the selector 1601 is, as required, inserted on the side of the reference signal CLK2. Instead of the equivalent delay circuit 1602, further, it is also allowable to insert any delay circuit so that the reference signal and the data signal have a desired phase difference relative to each other. The signal PHI determines the timing for successively transmitting the signals at the nodes DBx, DBy to the succeeding stage.

In this simultaneous arrival judging circuit, the signal DQ is received upon the rise of the signal at the node Cx and Cy. Accordingly, the signal CLK2 is connected to the node Cy through a circuit 1603 having a predetermined delay ta. In the constitution of this embodiment, the predetermined delay ta defines a maximum error in judging the simultaneous arrival of the reference signal CLK2 and the data signal DQi (i=0 to 3). Depending upon the cases, therefore, the delay time may be controlled from outside the chip.

The predetermined delay circuit 1603 can be realized by, for example, drawing around the wiring in the memory chip or by connecting the inverter circuits of stages of even numbers in series.

Figure 17A:
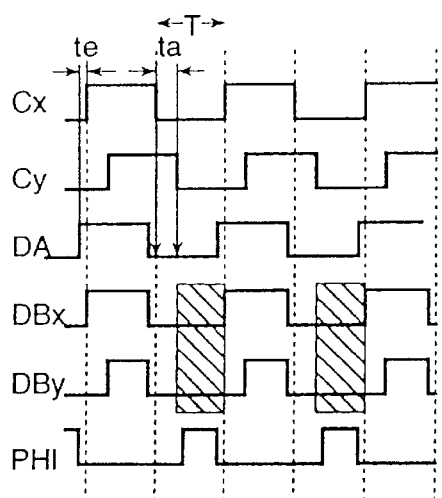
FIGS. 17A, 17B and 17C are timing diagrams of operation timings of the simultaneous arrival judging circuit shown in FIG. 16.
Figure 17B:
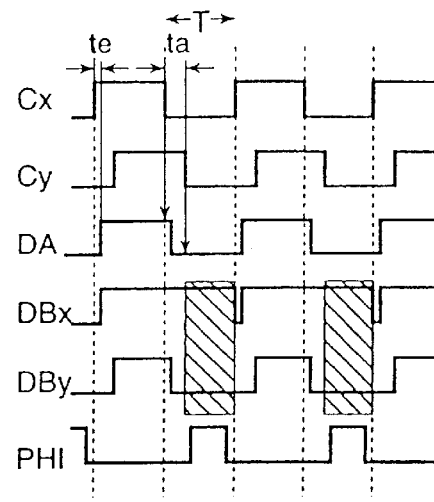
Figure 17C:
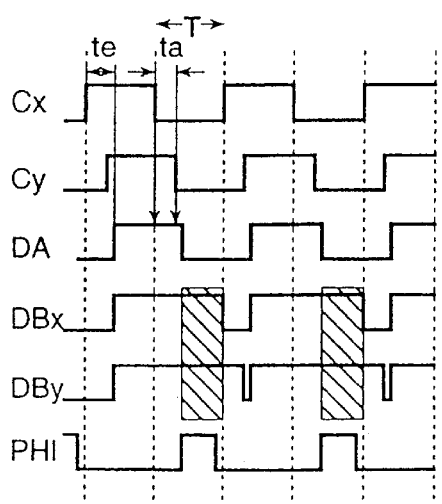

Next, the operation of the simultaneous arrival judging circuit of FIG. 16 will be described with reference to a timing charts shown in FIGS. 17A, 17B and 17C. In FIGS. 17A, 17B and 17C, reference numerals Cx, Cy, DA, DBx and DBy denote voltages at the nodes denoted by the same symbols in FIG. 16.

FIG. 17A is a case where the signal DQ has a phase earlier than the signal CLK2 by te: i.e., the signal at the node DA has a phase earlier by te than the signal at the node Cx, and the signals received at the nodes Cx and Cy all become 0 at the nodes DBx and DBy within a range of time t, i.e., within a hatched range ta<t<T.

FIG. 17B is a case where the signal DQ arrives nearly simultaneously with the signal CLK2: here, the signal at the node DA has a phase delayed by a small time te behind the node Cx. Here, however, it is presumed that the small time te is smaller than the delay ta. In this case, the signals received at the nodes Cx, Cy become 1 and 0, respectively, at the nodes DBx, DBy-within a range of time t, i.e., within a hatched range ta<t<T.

FIG. 17C is a case where the signal CLK2 has a phase earlier than the signal DQ: i.e., the signal at the node DA has a phase delayed by the time te behind the signal received at the node Cx, and the signals received at the nodes Cx, Cy are all 1 at the nodes DBx, DBy within a range of time t, i.e., within a hatched range ta<t<T.

In the above-mentioned three cases, the signals received at the nodes DBx, DBy in the time range ta<t<T are combined differently. Accordingly, when, for example, the signal DQ is earlier than the signal CLK2 due to logic gates NOR and AND, the signals CUP and CDN are set to be CUP="1" and CDN "0" (arrival of the signal DQ is delayed by increasing the delay counter). When the signal Dd arrives nearly simultaneously with the signal CLK2, the signals CUP and CDN are set to be CUP=CDN="0". When the signal CLK2 is earlier than the signal DQ, the signals CUP and CDN are set to be CUP="0" and CDN="1" (arrival of the signal DQ is quickened by decreasing the delay counter).

Conversely, the allowable range in which the simultaneous arrival is judged by the simultaneous arrival judging circuit is from 0 to ta of the delay of the signal DQ with respect to the signal CLK2.

In this embodiment, further, the simultaneous arrival is judged by each set of a reference signal and a data signal. However, the simultaneous arrival judging circuits may be arranged in a plural number to simultaneously compare a plurality of bits.

Figure 18:
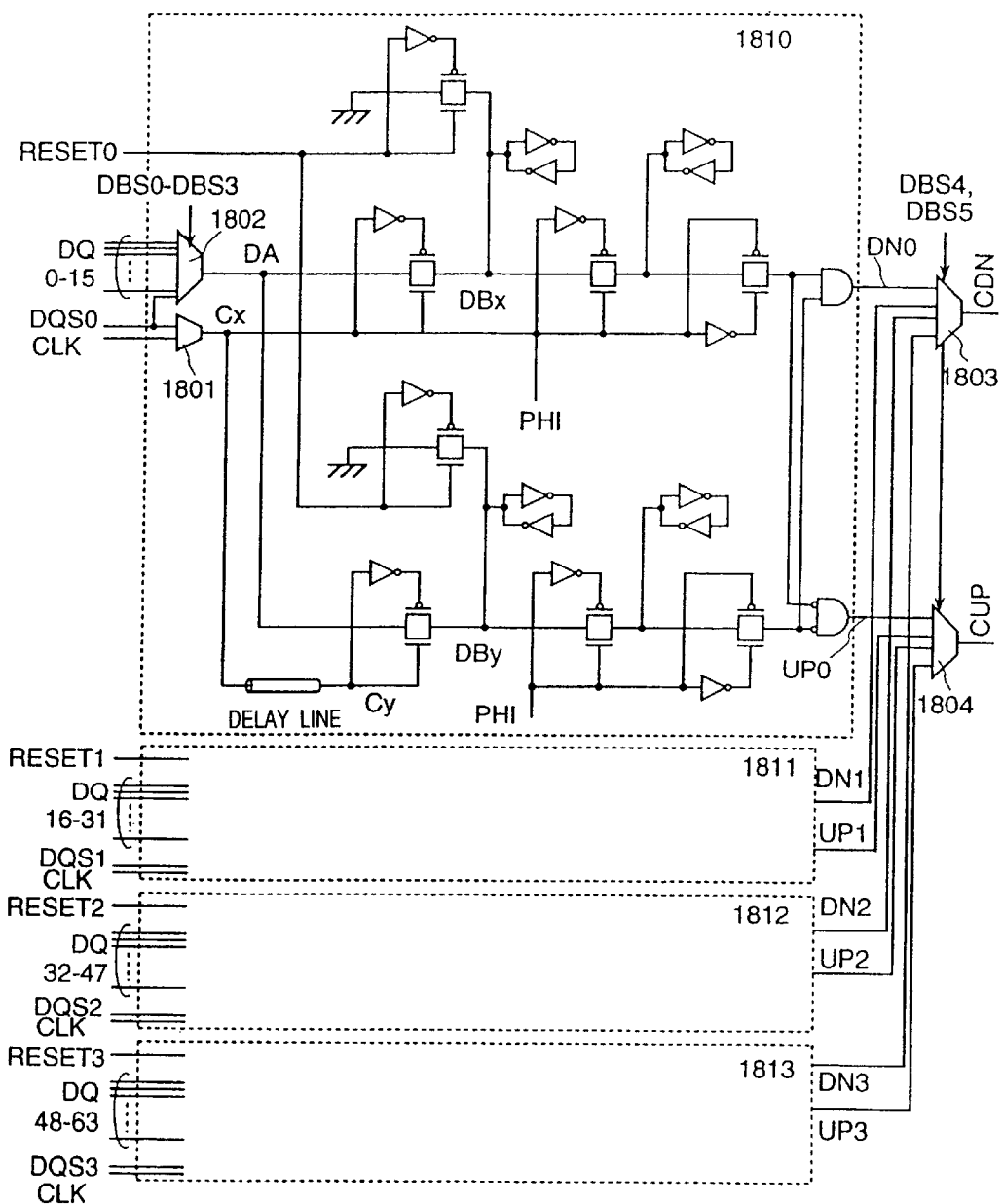
FIG. 18 is a schematic diagram illustrating the simultaneous arrival judging circuit in the memory controller LSI.

FIG. 18 illustrates an example of the simultaneous arrival judging circuit 1126 in the memory controller LSI shown in FIG. 11. The circuit for judging the simultaneous arrival can be constituted in the same manner as in FIG. 16. In this embodiment, however, the simultaneous arrival is judged for each set. Therefore, the set to be judged must be selected by a selector.

First, in order to eliminate the difference in the arrival time among the signals arriving at the simultaneous arrival judging circuit depending upon the slot positions of the memory modules, the signals (i=0 to 3) input to the simultaneous arrival judging circuit 1810 to 1813 are caused to arrive simultaneously with respect to the reference signal CLK in the memory controller LSI. Next, the data signals DQ are caused to arrive simultaneously with respect to the DQS signals. For this purpose, the signal DQSI and the signal CLK are selected as reference signals by a selector 1801, and any one signal is selected by another selector 1802 out of the 16 data signals corresponding to the signals DQSi such as data signals DQ0 to DQ15 as a signal to arrive simultaneously with the reference signals. Here, the selector 1802 selects the signal DQSi when the selector 1801 selects the signal CLK.

Similarly, the output signals of the simultaneous arrival judging circuits 1810 to 1813 are connected to the wirings of signals CUP and CDN through the selectors 1803 and 1004 so as to output the result which is now being judged. In this embodiment, the control signals of the selectors 1803 and 1804 are the signals DBS4 and DBS5. Here, the signal CR must be added to the control signal of the selector so that CUP=CDN="0" when the signal is CR="0" as defined in FIG. 12, or the logical product must be formed with the signal CR for the output signal like in FIG. 16.

In the foregoing, the circuit operations were separately described. Next, roughly described below with reference to FIGS. 19A and 19B is a rough procedure for adjusting the timings of the memory system to which is applied the data transmitter of the invention that includes the simultaneous arrival judging circuit and the timing adjusting circuit.

FIG. 19A illustrates the procedure for adjusting the timings for writing the data, i.e., illustrates the procedure for transmitting the reference signal CLK and data signal DQ from the memory controller LSI and for comparing the reference signal CLK2 formed in the SDRAM with the data signal DQ.

First, the timing is adjusted for writing data from the memory controller LSI onto the memory module DIMM0. For example, in the memory module using the SDRAM of the ×4 bit output shown in FIG. 6, the memory module DIMM0 is selected by the signal CSi, and the timings are adjusted for the signals CLK2 and DQ0 by the SDRAM0 on the DIMM0. Thereafter, the timings are successively adjusted for the signals CLK2, DQ1, DQ2 and DQ3 and, then, the timings are adjusted by the SDRAM1 for the signals CLK2, DQ4, DQ5, DQ6 and DQ7. The adjustment of timings by the DIMM0 is finished at a moment when the adjustment of timings is finished by the SDRAM15 for the signals CLK2 and DQ60 to DQ63.

Through the same procedure, the timings for the data signals DQ0 to DQ63 on the memory modules DIMM1, DIMM2 and DIMM3 are adjusted with respect to the reference signal CLK2 while changing the signals CSi. The adjustment of timings for writing data is finished at a moment when the timings are adjusted for all signals DQ on all memory modules.

Next, the procedure for adjusting the timings will be described with reference to FIG. 19B for reading the data from the SDRAM onto the memory controller LSI.

First, the reference signals DQS output from the memory modules are brought into synchronism with the reference signal CLK in the memory controller LSI in order to uniformalize the phases of all signals arriving at the memory controller LSI irrespective of the positions of the memory modules from which the data is to be read out. The synchronization is not absolutely necessary for receiving the data. It is, however, desired to execute the synchronization in order to facilitate the designing for timings in the memory controller LSI.

The objects of synchronization are not limited to the signals in the memory controller LSI. For example, the signals DQS transmitted from other slots may be adjusted for their timings by using, as a reference signal, a signal DQS transmitted from the memory module (DIMM0) closest to the memory controller LSI.

If the reference signal is fixed at all times to the reference signal CLK in the memory controller LSI, which is the receiver, the memory modules need not transmit the reference signals DQS, and the number of pins can be decreased. In this embodiment, four signals DQS0 to DQS3 are successively brought into synchronism with the reference signals for every memory module slot position. Due to this operation, the reference signals DQSi (i=0 to 3) all arrive simultaneously at the memory controller LSI no matter from which memory module the data is read out.

Next, the reference signals DQS and data signals DQ are successively brought into synchronism for the SDRAMs on the memory modules. In this embodiment, the data signals DQ0 to DQ15 are brought into synchronism with the reference signal DQS0, the data signals DQ16 to DQ31 are brought into synchronism with the reference signal DQS1, the data signals DQ32 to DQ47 are brought into synchronism with the reference signal and the data signals DQ48 to DQ63 are brought into synchronism with the reference signal DQS3.

This synchronization, too, need not necessarily be executed for all signals DQ. Though this trades off the precision of synchronization, only one of two signals DQ physically close to each other may be representatively brought into synchronism with the reference signal DQS to decrease the numbers of circuit elements in the registers and in the selectors and to decrease the number of signals that are to be brought into synchronism.

Figure 20:
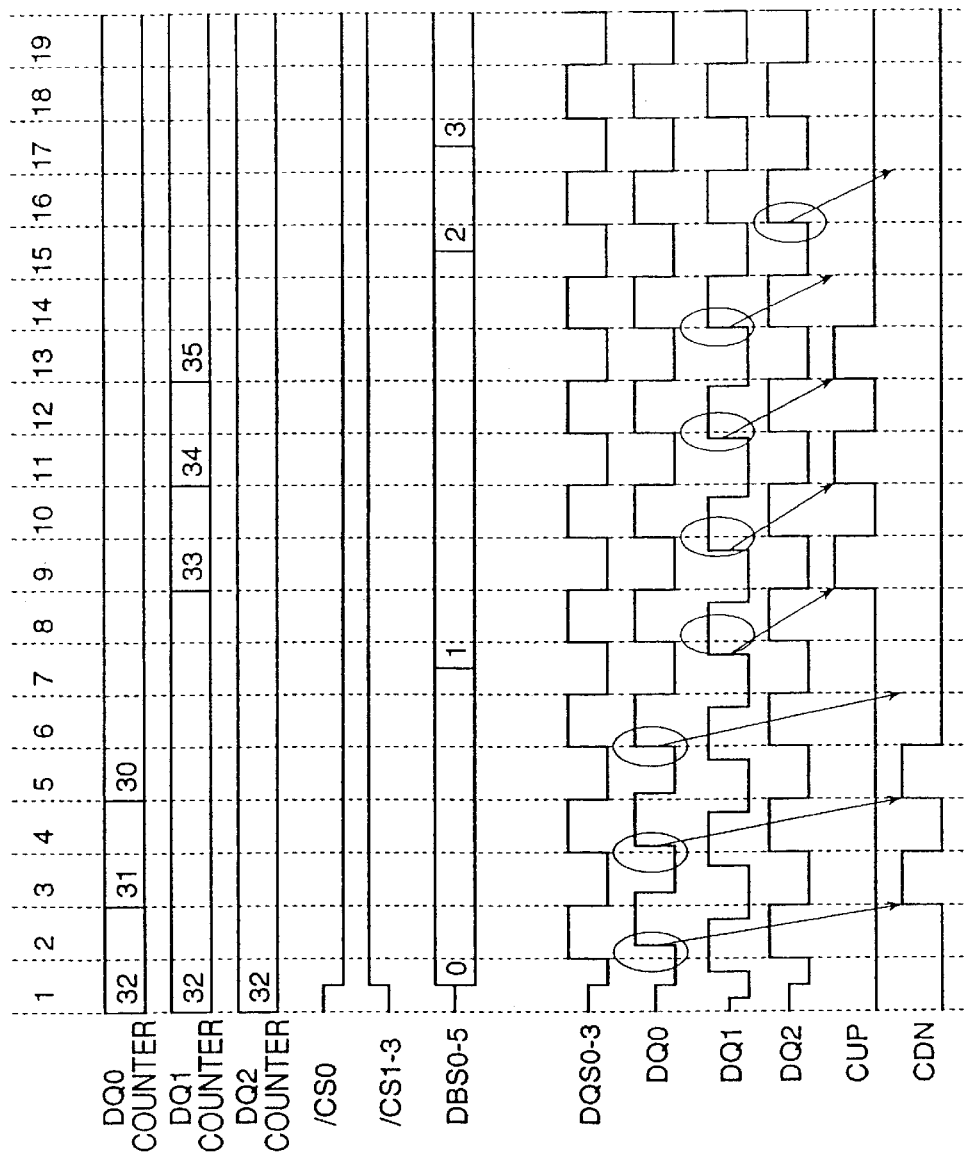
FIG. 20 is a timing diagram illustrating the procedure for adjusting the timings of data signals.

FIG. 20 illustrates a concrete example for adjusting the timings in the operation for reading the data. This example is need for bringing the data signals DQ0 to DQ3 output by the SDRAM0 on the memory module DIMM0 into synchronism with the signal DQS0.

At this moment, the signal DQS has already been brought into synchronism with the reference signal CLK in the memory controller LSI and is in phase therewith. Therefore, the signals DQS0 to DQS3 are described on one row. The DQi counter shows a value of the 6-bit delay counter of the data signal DQi, i.e., shows a value which results when 6 bits are converted into a decimal number. The initial values have been set to an intermediate value 32. A signal DQ3 and a DQ3 counter are not shown. This example is for synchronization on the memory module DIMM0. As for the selection signals/CS of the memory module, therefore, only the selection signal/CS0 representing the adjustment of timing of the SDRAM on th DIMM0 becomes "0", and the selection signals/CS1 to /CS3 become "1". The signals DBS0 to DBS5 are selection signals of bits that are successively sent from the memory controller LSI and that are to be adjusted for their timings, and their 6 bits are converted into decimal numbers. The signals DQS0 to DQS3, DQ0, DQ1 and DQ2 are those just prior to arriving at the simultaneous arrival judging circuit in the memory controller LSI.

When CR="1" is formed representing the mode for adjusting the timing for reading the data, all reference signals DQS and data signals DQ transmit alternating patterns in which 0101—are continuing.

First, in a time slot 2, the simultaneous arrival judging circuit in the memory controller LSI compares the data signal DQ0 selected by the signal DBS with the reference signal DQS0. As a result, it will be understood that the phase of the data signal DQ0 is delayed, and the signal CDN="1" is transmitted to the SDRAM in a time slot 3. This is received by the SDRAM0 only selected by the signal DBS, and it is learned that the data signal DQ0 has been delayed, and the delay counter of the signal DQ0 is decreased from 32 down to 31.

The data signal DQ0 is compared with the reference signal DQS0 in a time slot 4. Since the phase of the data signal DQ0 has still been delayed, the signal CDN="1" is transmitted in a time slot 5. The SDRAM0 decreases the counter from 31 down to 30, and advances the timing for producing the data signal DQ0.

In a time slot 6, it is assumed that the data signal DQ0 and the reference signal DQS0 have arrived simultaneously. Therefore, the results of phase comparison becomes CUP= CDN="0", whereby the signal DBS increases to compare the data signal DQ1 with the reference signal DQS0.

Similarly, hereinafter, the data signal DQ1 has a phase advancing ahead of the reference signal DQS0 as a result of judging the simultaneous arrival in time slots 8, 10 and 12 and, hence, the SDRAM0 increases the value of the delay counter (DQ1 counter) of the data signal DQ1 bit by bit, and the data signal DQ1 and the reference signal DQS0 arrive simultaneously in a time slot 14.

Upon repeating this procedure, the simultaneous arrival of the signals DQS and the reference signal CLK in the memory controller LSI can be realized for all signals DQ transmitted from all memory modules.

According to the memory system of the first embodiment to which the data transmitter of the invention is applied as described above, the phases of the data signals transmitted in parallel at a receiving point can be brought to lie within a permissible error range. Therefore, the window for receiving data is prevented from being decreased by a difference in the propagation delay time even when there is a difference in the lengths of paths among the parallel data wirings or a difference in the load capacities inclusive of parasitic elements.

The timings are adjusted once as part of a procedure for driving after the power source circuit is closed, and is then effected after a suitable time interval while the memory system is in operation to update the delay amount storage register. This is to compensate for a change in the temperature and a change in the power source voltage during the operation.

The adjustment of timings while the memory system is in operation lowers the operation efficiency of the memory system. Therefore, the adjustment may not be effected at one time for all bits but may be divided for several bits each time.

When much time is not spent for the renewal processing of one time so that the transmission efficiency is not lost, the setup time for receiving data signals and the holding time can be maintained by simply renewing the value of the delay storage resister for only several bits though a completely simultaneous arrival may not be realized.

Further, immediately after having returned from a sleeping state where it is considered that the temperature changes to a large extent, it is desired to adjust the timing like immediately after the start of the system.

In this embodiment, further, the signals DBS, CR and CW were transmitted through independent wirings to select bits for judging the simultaneous arrival. However, signals transmitted in one direction only from the memory controller LSI to the SDRAM like signals DBS can be transmitted by using, for example, address signals. Usually, the SDRAM possesses a mode register. Therefore, states specified by the signals CR, CW of the embodiment can be assigned as the modes. For example, in the mode corresponding to CR="1" or CW="1", any six address signals may be assigned to the signals DBS0 to DBS5 in the first embodiment, and these signals may be decoded in the SDRAM. The signals CUP, CDN must be transmitted in two directions, and may be obtained by, for example, time-dividing the signals DQ. Then, the embodiment can be put into practice without newly providing the wirings.

Figure 1:
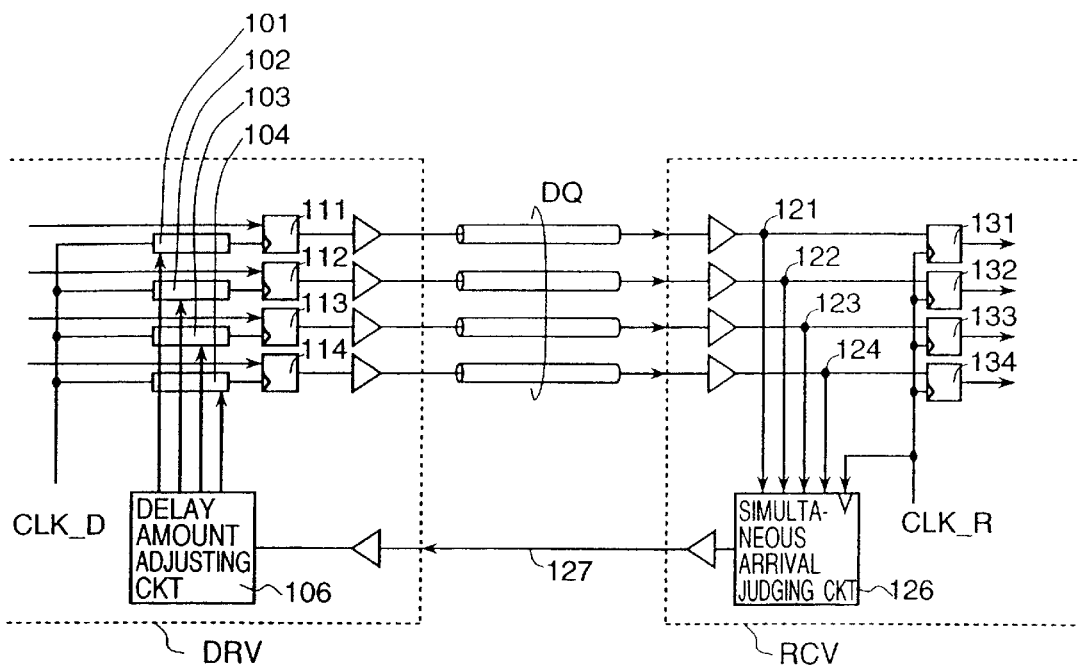
FIG. 1 is a diagram schematically illustrating a first embodiment of a data transmitter in which the timing is adjusted by using a driver.

The above first embodiment can be produced as illustrated in FIG. 1. That is, the receiver RCV for receiving parallel data signals possesses the simultaneous arrival circuit 126, and the driver DRV for transmitting the parallel data possesses a timing adjusting mechanism.

The first embodiment deals with the case where the memory controller LSI and the SDRAM serve as a driver and a receiver, and the timing adjusting mechanism is provided on the side of the driver. When this constitution is employed, the simultaneous arrival judging circuit 126 in the receiver RCV judges the simultaneous arrival of the reference signals CLK_R for receiving the data and of the parallel data signals 121 to 124 of just before being input to the flip-flops 131 to 134 for receiving the data, and the result 127 of phase comparison is sent to the driver DRV. Here, a triangle symbol in the simultaneous arrival judging circuit 126 represents an input terminal of the reference signal CLK_R.

Upon receipt of the result 127 of phase comparison from the receiver RCV, the timing adjusting mechanism comprising the delay amount adjusting circuit 106 and variable delay circuits 101 to 104 in the driver DRV, uniformalizes the phases of the parallel data 121 to 124 at a point of receiving the data. In FIG. 1, the variable delay circuits 101 to 104 change the timings of the reference signals CLK_D input to the flip-flops 111 to 114 that determine the phases of the data signals. It is, however, also possible to adjust the timings by placing the variable delay circuits in the data output paths.

In FIG. 1, the reference signals CLK_D for outputting the data and the reference signals CLK_R for receiving the data are described as separate signals. As described in the first embodiment, however, the driver DRV may transmit the reference signals CLK_D together with the data signals, and the receiver RCV may use the received reference signals CLK_D as the reference signals CLK_R.

Further, one of the received data signals may be used as the reference signal CLK_R. In such a case, the simultaneous arrival may be judged after the reference signal to be input to the reference signal input terminal of the simultaneous arrival judging circuit 126 has passed through a delay circuit such as the delay circuit 1602 shown in FIG. 16 to obtain a suitable phase for receiving the data.

FIGS. 21A and 21B are diagrams illustrating examples of a second embodiment in which the receiver RCV is provided with the simultaneous arrival judging circuit and the timing adjusting mechanism. This constitution is suitable for use in a case where it is desired to suppress an increase in the number of circuit elements on the side of the driver DRV, but it is possible to increase the number of circuit elements on the side of the receiver.

FIG. 21A illustrates an example of when the timing adjusting mechanism comprising variable delay circuits 2101 to 2104 and the delay amount adjusting circuit 2106 is provided on the side of the receiver RCV, the variable delay circuits 2101 to 2104 being provided on the paths of the reference signals CLK_R for receiving data. Therefore, the signal 2127 for transmitting the result of phase comparison, too, serves as an internal signal of the receiver RCV. In this case, the selector 2125 is provided so that the simultaneous arrival judging circuit 2126 is allowed to compare the phases of the data signals 2111 to 2114 with the phases of the reference signals 2121 to 2124 corresponding to the data signals after their timings have been adjusted. More specifically, the reference signals are selected by the selector 2125 so as to judge the simultaneous arrival of data signal 2111 and reference signal 2121, data signal 2112 and reference signal 2122, data signal 2113 and reference signal 2123, and data signal 2114 and reference signal 2124.

FIG. 21B illustrates another example of when the timing adjusting mechanism is provided on the side of the receiver RCV to delay the data signals. In FIG. 21B, constituent portions which are the same as the constituent elements shown in FIG. 21A are denoted by the same reference numerals. In the case of this constitution, the variable delay circuits 2101 to 2104 are controlled by the delay amount adjusting circuit 2106, so that the data signals 2111 to 2114 and the reference signals CLK_R arrive simultaneously. If compared with the constitution of FIG. 21A, the selector 2125 for selecting the reference signals CLK_R is not required, and the constitution can be simplified.

Figure 22:
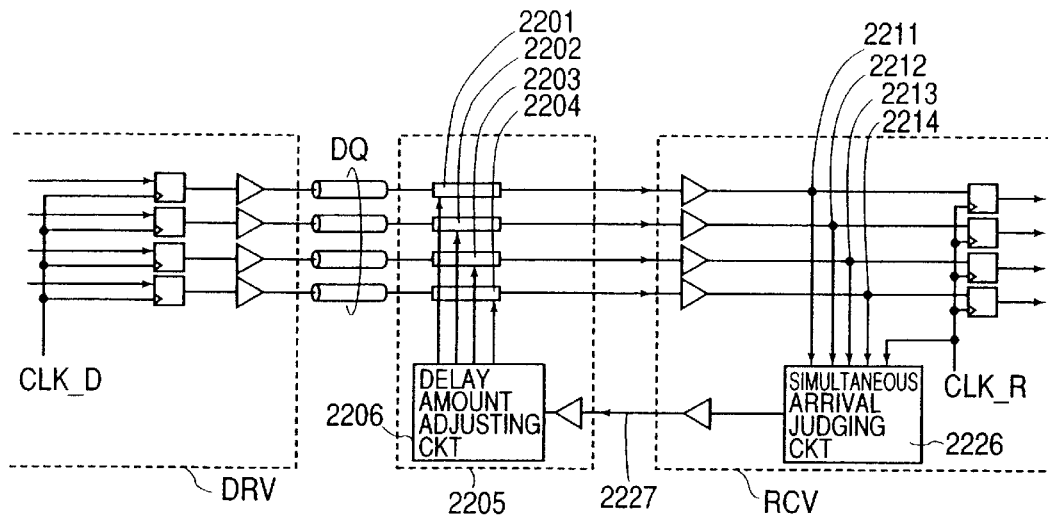
FIG. 22 is a schematic diagram illustrating a data transmitter in which the simultaneous arrival is judged by the receiver, and the mechanism for adjusting the timing is provided on a chip which is neither the driver nor the receiver according to a third embodiment of the invention.

FIG. 22 is a diagram illustrating the constitution of a third embodiment in which the timing adjusting mechanism is provided on a chip which is neither the driver DRV nor the receiver RCV. In this embodiment, the result of simultaneous arrival of the data signals 2211 to 2214 and reference signals CLK_R judged by the simultaneous arrival judging circuit 2226 on the receiver RCV is transmitted to a timing adjusting chip 2205 using a signal 2227. Upon receipt of this signal, the delay adjusting circuit 2206 adjusts the delay amounts of the variable delay circuits 2201 to 2204 so that the data signals 2211 to 2214 and reference signals CLK_R arrive simultaneously at the receiver.

Figure 23:
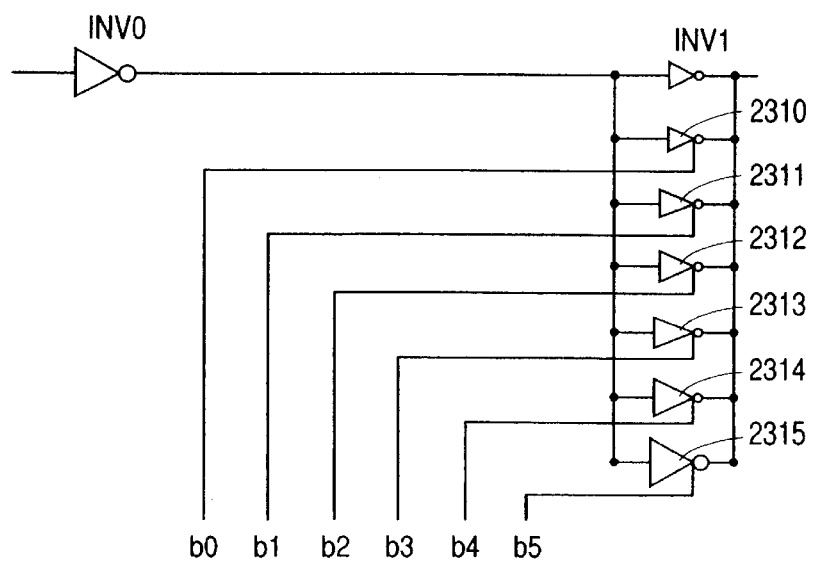
FIG. 23 is a schematic circuit diagram illustrating another timing-adjusting-mechanism.

FIG. 23 illustrates another example of the timing adjusting mechanism. In FIG. 23, output buffer circuits of the final stage for the data signals are formed by an inverter INV1 and 3-state buffers 2310 to 2315 connected in parallel therewith. In particular, when the timings are to be adjusted on the chip on the driver side as in the first embodiment, drive forces of the output buffers of the driver are varied to effectively adjust the timings.

Here, the control signals b0 to b5 of the 3-state buffers are, for example, the outputs of the delay amount adjusting circuits shown in FIG. 13. If the 3-state buffers 2310 to 2315 work as drivers when the signal is bi="0" and work as high impedances (Hi-Z) when the signal is bi="1", then, the operation becomes logically the same as the variable delay circuits of the first embodiment shown in FIG. 14.

In order to monotonously change the delay time depending upon the value of the signal bi (i=0 to 5), further, the sizes of the MOS transistors W/L of the buffers controlled by b0 to b5 should be designed to successively increase in the order of 2311, —, 2315 starting from the buffer 2310.

In the foregoing, there has been described preferred embodiments of the data transmitter of the invention, which are applied to transmitting parallel data between the driver and the receiver, one of which being the memory controller LSI (a semiconductor chip) and the other one of which being memory modules (semiconductor device constituted by a plurality of semiconductor chips). However, the invention is in no way limited to the above embodiments only, but can be applied to all of the cases where parallel data is to be transmitted, and can be designed in various other ways without departing from the spirit and scope of the invention.

For example, the invention can be applied to transmitting parallel data between the chips each being constituted by a semiconductor chip in both the driver and the receiver, like transmitting parallel data between the memory controller LSI and the MPU, as shown in FIG. 2. The invention can be further applied to transmitting parallel data between the devices, each being constituted by a plurality of semiconductor devices in both the driver and the receiver. Further, it needs not be pointed out that the invention can be applied to preventing skew among the circuit blocks that must transmit parallel data at high speed in the semiconductor chip.

As described above, the invention enables the data signals to simultaneously arrive at the receiver, and makes it possible to realize a parallel data transmitter enabling data to be transmitted without error even when there is a difference in the lengths of paths among the data wirings or a difference in the load capacities inclusive of parasitic elements in transmitting data at high speeds in a short period.

As a subsidiary effect, further, the invention permits a difference in the lengths of wirings for the parallel data and a difference in the load capacities, relaxing the limitation on the layout on the printed board, in the memory modules and in the driver and receiver chips, facilitating the designing.

It is further possible to realize a parallel data transmitter which is immune to a change in the environment, such as the temperature and the like, while the device is in operation and is immune to the skew caused by a fluctuation in the power source voltage, which is dependent upon the transmission data pattern.

What is claimed is:

1. A data transmit system comprising:

a driver which outputs parallel signals each including data represented by a plurality of parallel bits;

a receiver which takes in said parallel bits in response to a reference signal; and a circuit which separately adjusts arriving time of each of said parallel bits at input terminals of said receiver so that said arriving time of each of said parallel bits are made to be substantially the same time.

2. A data transmit system comprising:

a first semiconductor chip which outputs parallel signals each including data represented by a plurality of parallel bits; and a second semiconductor chip which receives said parallel bits, wherein said second semiconductor chip includes a comparator which separately compares phases of said parallel bits with a reference signal, and wherein said first semiconductor chip includes a timing adjusting circuit which adjusts said phases among said parallel bits based on results of said comparator so that arriving times of said parallel bits at said second semiconductor chip are substantially the same.

3. A data receiver comprising:

a plurality of input terminals which receives parallel signals including data represented by a plurality of parallel bits;

a first circuit which separately compares said parallel bits with a reference signal; and a second circuit which adjusts phases among said parallel bits based on a result of comparison by said first circuit, wherein adjustment of phases among said parallel bits causes arriving times of said parallel bits at said input terminals to be substantially equal to a reference time.

* * * * *